US008338963B2

(12) United States Patent
Haba et al.

(10) Patent No.: US 8,338,963 B2
(45) Date of Patent: Dec. 25, 2012

(54) MULTIPLE DIE FACE-DOWN STACKING FOR TWO OR MORE DIE

(75) Inventors: Belgacem Haba, Saratoga, CA (US); Wael Zohni, San Jose, CA (US); Richard Dewitt Crisp, Hornitos, CA (US); Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/306,300

(22) Filed: Nov. 29, 2011

(65) Prior Publication Data

US 2012/0267798 A1 Oct. 25, 2012

Related U.S. Application Data

(60) Provisional application No. 61/477,877, filed on Apr. 21, 2011.

(51) Int. Cl.
*H01L 23/52* (2006.01)
(52) U.S. Cl. .. 257/777; 257/778; 257/782; 257/E25.001
(58) Field of Classification Search .................. 257/777, 257/778, 782, 784, E25.001
See application file for complete search history.

(56) References Cited

U.S. PATENT DOCUMENTS

| 5,480,840 | A | * | 1/1996 | Barnes et al. ................. 438/107 |
| 5,977,640 | A | | 11/1999 | Bertin et al. |
| 5,998,864 | A | * | 12/1999 | Khandros et al. ............. 257/723 |
| 6,199,743 | B1 | | 3/2001 | Bettinger et al. |
| 6,385,049 | B1 | | 5/2002 | Chia-Yu et al. |
| 6,414,396 | B1 | | 7/2002 | Shim et al. |
| 6,445,594 | B1 | | 9/2002 | Nakagawa et al. |
| 6,583,502 | B2 | | 6/2003 | Lee et al. |
| 6,703,713 | B1 | | 3/2004 | Tseng et al. |
| 6,720,666 | B2 | | 4/2004 | Lim et al. |
| 6,742,098 | B1 | | 5/2004 | Halbert et al. |
| 6,762,942 | B1 | | 7/2004 | Smith |
| 6,811,580 | B1 | | 11/2004 | Littecke |
| 6,818,474 | B2 | | 11/2004 | Kim et al. |

(Continued)

FOREIGN PATENT DOCUMENTS

JP 2002-076252 A 3/2002

(Continued)

OTHER PUBLICATIONS

Office Action from Korean Patent Application No. 10-2010-0129890 dated Jan. 18, 2011.

(Continued)

*Primary Examiner* — David Vu
*Assistant Examiner* — Duy T Nguyen
(74) *Attorney, Agent, or Firm* — Lerner, David, Littenberg, Krumholz & Mentlik, LLP

(57) ABSTRACT

A microelectronic assembly is disclosed that comprises a substrate having first and second openings, a first microelectronic element and a second microelectronic element in a face-down position. The first element has an active surface facing the front surface of the substrate and bond pads aligned with the first opening, a rear surface remote therefrom, and an edge extending between the front and rear surfaces. The second microelectronic element has a front surface facing the first microelectronic element and projecting beyond an edge of the first microelectronic element, and bond pads at the front surface of the second microelectronic element aligned with the second opening.

30 Claims, 23 Drawing Sheets

U.S. PATENT DOCUMENTS

| | | | |
|---|---|---|---|
| 7,061,105 B2 | 6/2006 | Masuda et al. | |
| 7,061,121 B2 | 6/2006 | Haba | |
| 7,095,104 B2 | 8/2006 | Blackshear | |
| 7,205,656 B2 | 4/2007 | Kim et al. | |
| 7,389,937 B2 | 6/2008 | Ito | |
| 7,504,284 B2 | 3/2009 | Ye et al. | |
| 7,633,146 B2 | 12/2009 | Masuda et al. | |
| 7,638,868 B2 * | 12/2009 | Haba | 257/686 |
| 8,026,589 B1 | 9/2011 | Kim et al. | |
| 2001/0005311 A1 | 6/2001 | Duesman et al. | |
| 2002/0053727 A1 | 5/2002 | Kimura | |
| 2003/0064547 A1 | 4/2003 | Akram et al. | |
| 2003/0183917 A1 | 10/2003 | Tsai et al. | |
| 2003/0193788 A1 | 10/2003 | Farnworth et al. | |
| 2004/0016999 A1 | 1/2004 | Misumi | |
| 2004/0124520 A1 | 7/2004 | Rinne | |
| 2004/0184240 A1 * | 9/2004 | Su | 361/717 |
| 2005/0110162 A1 | 5/2005 | Meyer-Berg et al. | |
| 2005/0116358 A1 * | 6/2005 | Haba | 257/789 |
| 2005/0133932 A1 | 6/2005 | Pohl et al. | |
| 2005/0164486 A1 | 7/2005 | Lua et al. | |
| 2005/0173807 A1 | 8/2005 | Zhu et al. | |
| 2005/0258538 A1 | 11/2005 | Gerber | |
| 2006/0027902 A1 | 2/2006 | Ararao et al. | |
| 2006/0113653 A1 | 6/2006 | Xiaoqi et al. | |
| 2006/0249827 A1 | 11/2006 | Fasano et al. | |
| 2006/0290005 A1 | 12/2006 | Thomas et al. | |
| 2007/0108592 A1 * | 5/2007 | Lai et al. | 257/700 |
| 2007/0120238 A1 | 5/2007 | Vaiyapuri | |
| 2007/0152310 A1 | 7/2007 | Osborn et al. | |
| 2007/0160817 A1 | 7/2007 | Roh | |
| 2007/0164407 A1 | 7/2007 | Jun et al. | |
| 2007/0218689 A1 | 9/2007 | Ha et al. | |
| 2008/0036067 A1 | 2/2008 | Lin | |
| 2008/0048777 A1 | 2/2008 | Kohjiro et al. | |
| 2008/0093725 A1 | 4/2008 | Jung et al. | |
| 2008/0136006 A1 | 6/2008 | Jang et al. | |
| 2009/0017583 A1 | 1/2009 | Jun et al. | |
| 2009/0051043 A1 | 2/2009 | Wong et al. | |
| 2009/0057864 A1 | 3/2009 | Choi et al. | |
| 2009/0200652 A1 | 8/2009 | Oh et al. | |
| 2009/0200680 A1 | 8/2009 | Shinohara et al. | |
| 2010/0065955 A1 | 3/2010 | Chye et al. | |
| 2010/0072602 A1 | 3/2010 | Sutardja | |
| 2010/0090326 A1 | 4/2010 | Baek et al. | |
| 2010/0193930 A1 | 8/2010 | Lee | |
| 2010/0244278 A1 | 9/2010 | Shen | |
| 2010/0295166 A1 | 11/2010 | Kim | |
| 2010/0321885 A1 | 12/2010 | Huang | |
| 2010/0327419 A1 | 12/2010 | Muthukumar et al. | |
| 2011/0079905 A1 | 4/2011 | Sanchez et al. | |
| 2012/0091574 A1 | 4/2012 | Lin et al. | |

FOREIGN PATENT DOCUMENTS

| | | |
|---|---|---|
| JP | 2004-063767 A | 2/2004 |
| JP | 2005251957 A | 9/2005 |
| JP | 2008-198841 A | 8/2008 |
| JP | 2010-098098 A | 4/2010 |
| KR | 2001-0002214 A | 1/2001 |
| KR | 2001-0081922 A | 8/2001 |
| KR | 20010081922 A | 8/2001 |
| KR | 2005-0119414 A | 12/2005 |
| KR | 2006-0120365 A | 11/2006 |
| KR | 20060120365 A | 11/2006 |
| KR | 10-0690247 B1 | 2/2007 |
| KR | 1020060004298 | 3/2007 |
| KR | 2007-0088177 A | 8/2007 |
| KR | 2009-0008341 A | 1/2009 |
| KR | 2009-0086314 A | 8/2009 |
| KR | 2010-0041430 A | 4/2010 |

OTHER PUBLICATIONS

Search Report from Korean Patent Application No. 10-2010-0129890 dated Jan. 18, 2011.
Partial International Search Report Application No. PCT/US2011/031391, dated Aug. 25, 2011.
International Search Report Application No. PCT/US2011/031391, dated Dec. 12, 2011.
Asinash Roy et al: "Effects of Coupling Capacitance and Inductance on Delay Uncertainty and Clock Skew", 2007 44TH ACM/IEEE Design Automation Conference, San Diego, CA, Jun. 4-8, 2007, IEEE, Piscataway, NJ, Jun. 1, 2007, pp. 184-187, XP031183328.
Office Action from Korean Patent Application No. 10-2010-0129888 dated Jan. 18, 2011.
Search Report from Korean Patent Application No. 10-2010-0129888 dated Jan. 18, 2011.
Korean Search Report from U.S. Appl. No. 61/477,877, dated Sep. 6, 2011.
Korean Search Report from U.S. Appl. No. 61/477,820, dated Sep. 6, 2011.
Korean Search Report from U.S. Appl. No. 61/477,883, dated Sep. 6, 2011.
Korean Search Report from U.S. Appl. No. 61/477,967, dated Sep. 6, 2011.
Korean Application No. 10-2011-0041843, dated May, 3, 2011 (English translation of Spec and drawings).
International Search Report and Written Opinion for PCT/US2012/034196 dated Jun. 4, 2012.
International Search Report and Written Opinion for application No. PCT/US2012/029873 dated Jun. 4, 2012.
Partial International Search Report for Application No. PCT/US2012/032997 dated Jun. 27, 2012.
International Search Report and Written Opinion for Application No. PCT/US2012/032997 dated Aug. 7, 2012.

* cited by examiner

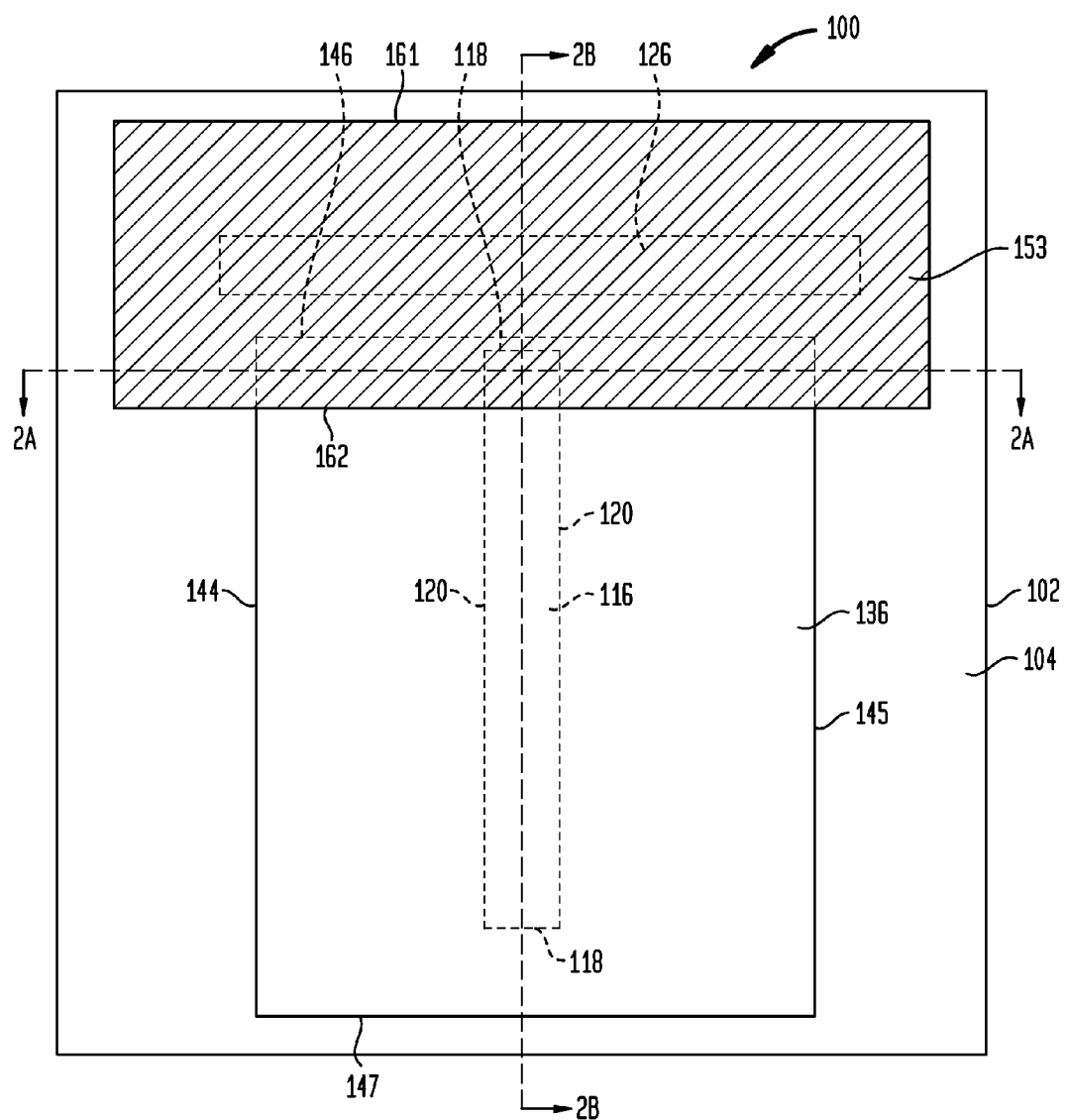

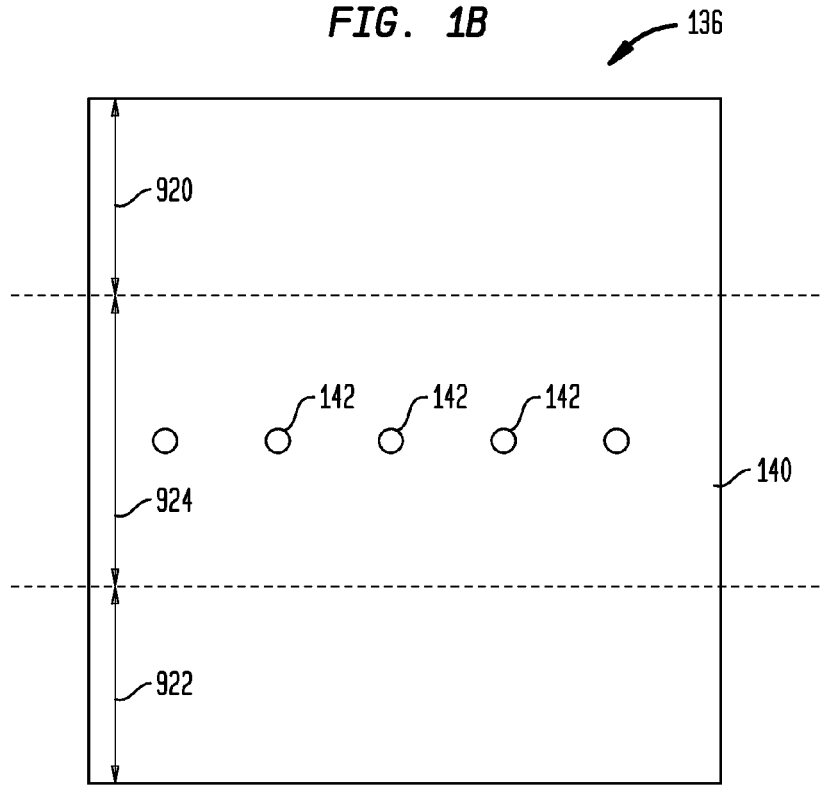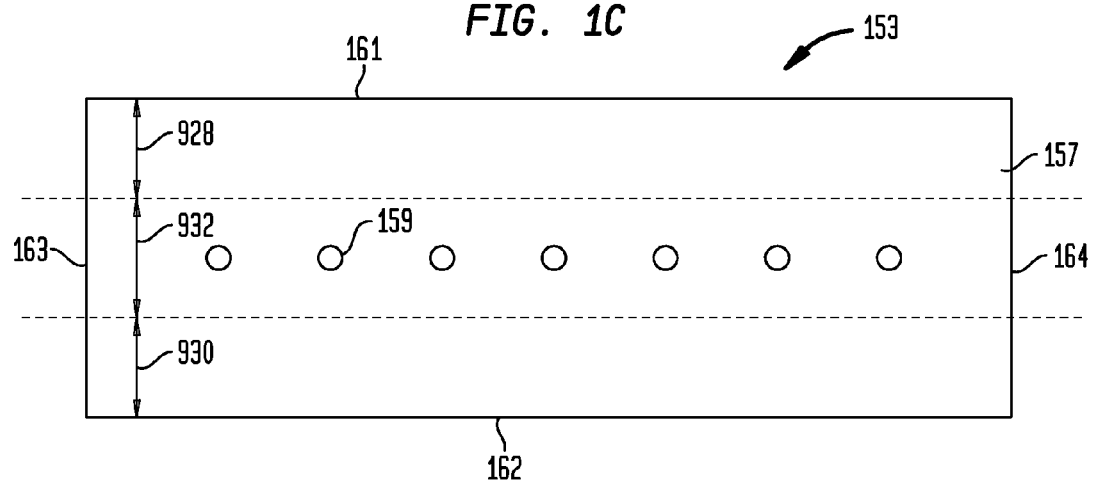

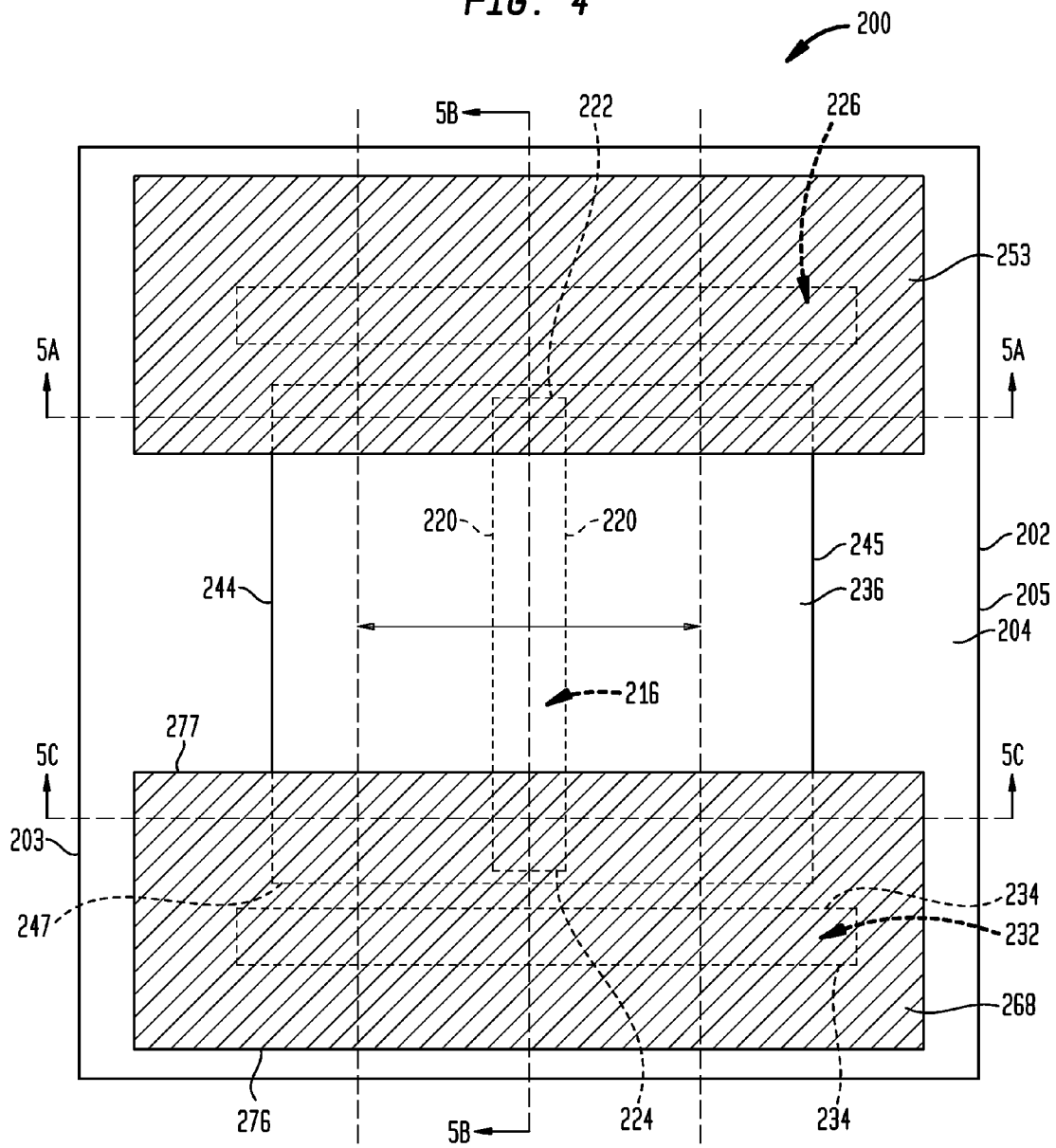

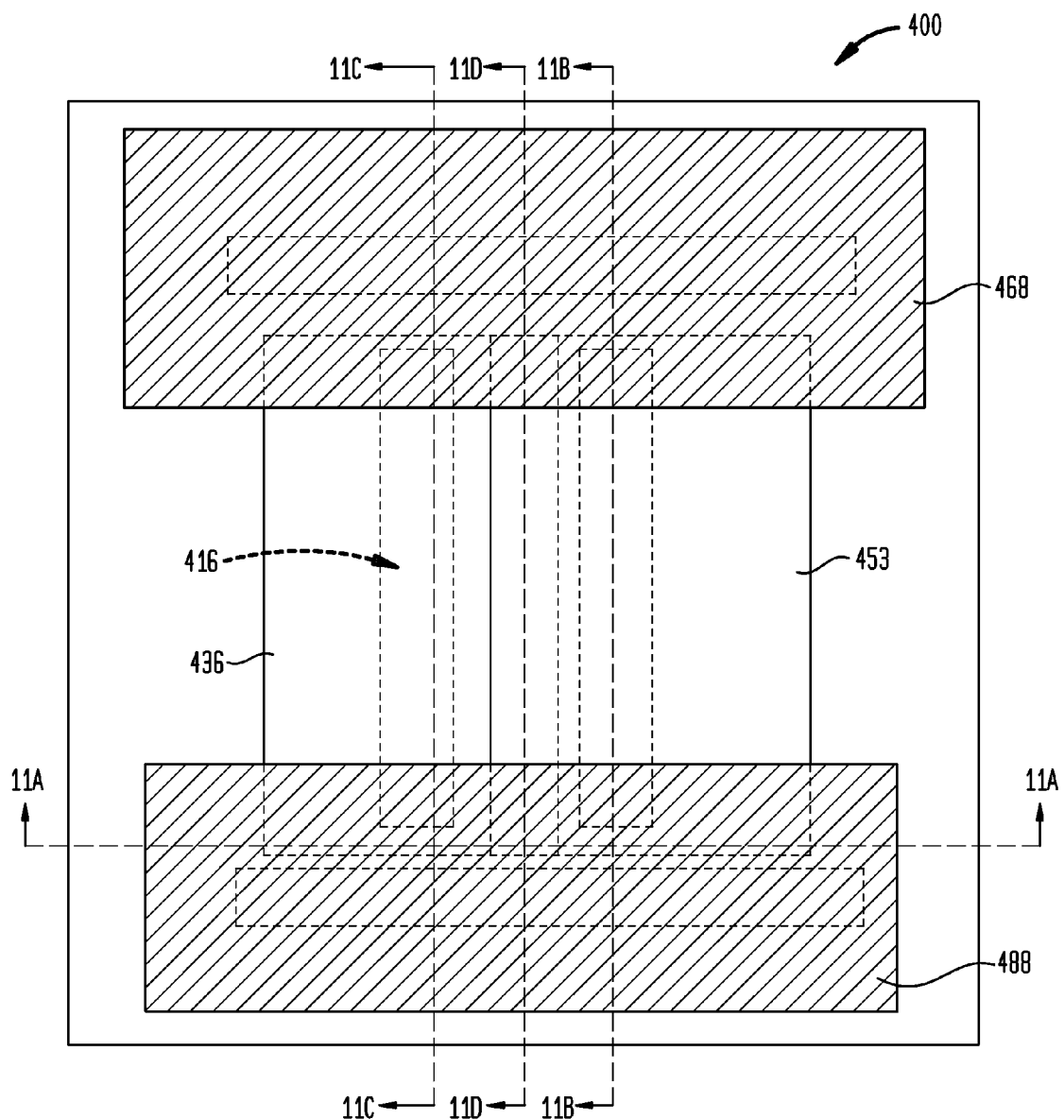

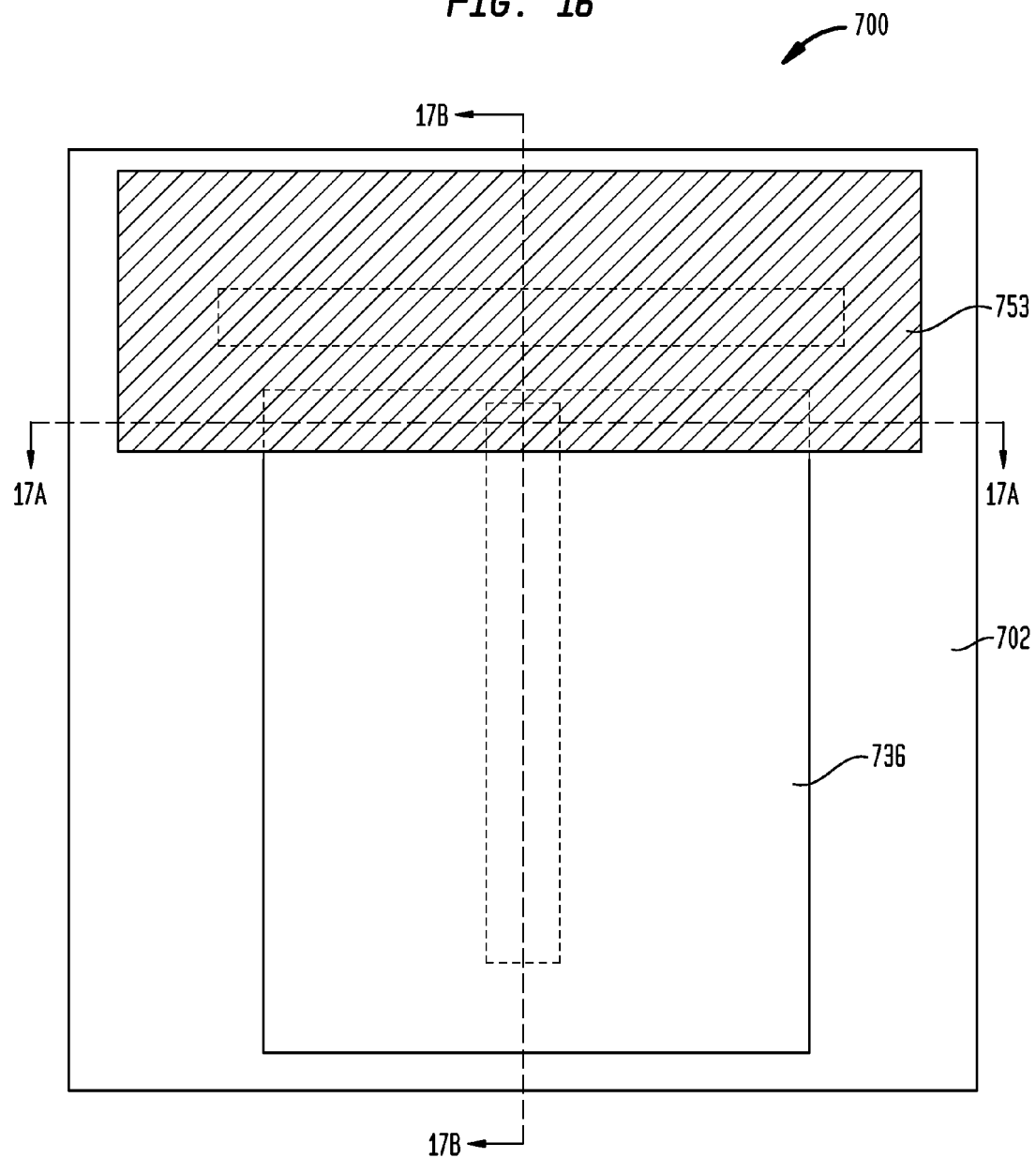

MULTIPLE DIE FACE-DOWN STACKING FOR TWO OR MORE DIE

CROSS-REFERENCE TO RELATED APPLICATIONS

The present application claims the benefit of the filing date of U.S. Provisional Patent Application Ser. No. 61/477,877, filed Apr. 21, 2011, the disclosure of which is hereby incorporated by reference herein. The following commonly-owned applications are hereby incorporated by reference herein: U.S. Provisional Patent Application Ser. Nos. 61/477,820, 61/477,883, and 61/477,967, all filed Apr. 21, 2011.

BACKGROUND OF THE INVENTION

The present invention is directed to microelectronic assemblies that include stacked semiconductor chips in a face-down orientation, as well as methods of manufacturing same.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a substrate, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

It is also desirable to produce a chip package that presents a low, overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; and U.S. Pat. No. 5,347,159, the disclosures of which are incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

SUMMARY OF THE INVENTION

A microelectronic assembly includes a substrate that has first and second openings and first and second microelectronic elements with bond pads thereon. The substrate further includes first and second surfaces extending in first and second transverse directions, first and second openings extending between first and second major surfaces thereof. The first opening has a long dimension in the first direction and the second opening has a long dimension in the second direction. There is a first microelectronic element having a front surface confronting the first surface and bond pads at the front surface aligned with the first opening. There is a rear surface remote therefrom, and an edge extending between the front and rear surfaces. The second microelectronic element has a front surface that faces the first microelectronic element and that projects beyond an edge of the first microelectronic element, and bond pads at the front surface of the second microelectronic element aligned with the second opening. The bond pads of the first and second microelectronic elements are electrically connected to conductive elements of the substrate.

In one embodiment, the bond pads are electrically connected to the conductive elements by first leads having portions aligned with the first opening and second leads having portions aligned with the second opening. The bond pads may be electrically connected to the conductive elements by first wire bonds extending through the first opening and second wire bonds extending through the second opening. In one example, at least one of the first leads or the second leads do not extend through the first opening in the substrate.

In another alternative embodiment, a heat spreader may be in thermal communication with the first and second microelectronic elements. The heat spreader may be in thermal contact with a portion of at least one of the first or second microelectronic elements. Alternatively, the heat spreader may be in thermal contact with only the second microelectronic element.

In an alternative embodiment, the bond pads of the first microelectronic element are disposed in a central region of the front surface. The central region may be positioned a middle third of the way between first and second opposed edges of the first microelectronic element. The bond pads of the second microelectronic element may also alternatively extend along a central region of the second microelectronic element. The central region may be positioned a middle third of the way between first and second opposed edges of the first microelectronic element.

In another embodiment, the bond pads of the second microelectronic element may instead extend along a peripheral edge of the second microelectronic element. The first opening may be aligned with a peripheral region of the first microelectronic element. Alternatively, the second opening may be aligned with a peripheral region of the second microelectronic element.

In still another embodiment, the microelectronic assembly includes a third microelectronic element and the substrate further includes a third opening. The third microelectronic element may overlie the first microelectronic element and extend beyond an edge thereof. Bond pads at the front surface of the third microelectronic element may be aligned with the third opening and electrically connected to the conductive elements. The bond pads may extend along a central region of the third microelectronic element. Third leads may also connect the bond pads on the third microelectronic element with at least some of the third conductive elements. The third leads may be wire bonds.

In another embodiment, the third opening may be aligned with a peripheral edge of the third microelectronic element.

In still another embodiment, the surfaces of the second and third microelectronic elements are positioned on the same plane. The third microelectronic element may overlie at least a portion of the second microelectronic element.

In yet another embodiment, there is a system that comprises one of the aforementioned assemblies in this aspect of the invention and one or more other electronic components electrically connected to the assembly. The system may further comprise a housing. The assembly and the other electronic components may be mounted to the housing. In a particular example, the first opening may comprise a plurality of openings.

Turning to another aspect of the disclosed invention, a microelectronic assembly includes a substrate that has first and second openings, a first microelectronic element with bond pads thereon, and a second microelectronic element with bond pads thereon. The substrate has opposed first and second surfaces that each extend in first and second transverse directions. The first and second openings extend between the first and second surfaces. The first opening has a long dimension in the first direction and the second opening has a long dimension in the second direction. The first microelectronic element may have a front surface that confronts the first surface of the substrate and a rear surface that is remote from the front surface. Bond pads at the front surface of the first microelectronic element may be aligned with the first opening. The first microelectronic element may have an edge that extends between the front surface and rear surface. The second microelectronic element may have a front surface that faces the first microelectronic element. First and second opposed edges may bound the front surface. The second microelectronic element may have a first edge that projects beyond an edge of the first microelectronic element such that bond pads at the front surface of the second microelectronic element are aligned with the second opening. Contacts of the second microelectronic element are disposed in a central region of the front surface thereof. Each of the bond pads on the first and second microelectronic elements may be electrically connected to respective first and second conductive elements on the substrate.

Alternatively, in another embodiment, first leads may extend through the first opening and second leads may extend through the second opening. The first and second conductive elements on the substrate may be first and second contacts respectively. The first leads may electrically connect at least some of the bond pads of the first microelectronic element with the first conductive elements on the second surface of the substrate. The second leads may extend through the second opening and electrically connect at least some of the bond pads of the second microelectronic element with the second conductive elements on the second surface of the substrate.

In another embodiment, first leads may be electrically connected to the first surface of the substrate and second leads may be electrically connected to the first surface, through the second opening. First and second conductive elements on the substrate are first and second contacts respectively, and the first leads may electrically connect at least some of the bond pads of the first microelectronic element with the first conductive elements on the second surface of the substrate. The second leads may be electrically connected to the first surface.

In still another embodiment, the first leads do not extend through the first opening in the substrate.

In an alternative embodiment, a heat spreader may be in thermal communication with the first and second microelectronic elements.

In yet another embodiment, first leads are bonded to the first contacts and second leads are bonded to the second contacts on the substrate. In one embodiment, the first and second leads are wire bonds.

In yet another embodiment, the first microelectronic element has a second edge opposed to the edge and the bond pads on the first microelectronic element are disposed in a central region of the first microelectronic element, the central region being positioned a middle third of a distance between the edge and the second edge of the first microelectronic element. The bond pads on the second microelectronic element may extend along a central region of the second microelectronic element, where the central region is positioned a middle third of a distance between a first edge and a second opposed edge of the second microelectronic element. Bond pads on the second microelectronic element may extend along an edge region of the second microelectronic element, where the edge region is positioned a first third of the distance between the first and second edges of the second microelectronic element.

In another embodiment, there is a third microelectronic element that is adjacent the second microelectronic element. The third microelectronic element has a front surface, a rear surface, and bond pads. The substrate may further include a third opening and third conductive elements. The third microelectronic element may include a second edge projecting beyond the first edge of the second microelectronic element such that bond pads at the front surface of the third microelectronic element are aligned with the third opening. The second edge of the third microelectronic element may overlie the edge of the first microelectronic element or first edge of the second microelectronic element. Bond pads on the third microelectronic element may be electrically connected to at least some of the third conductive elements. The bond pads may extend along a central region of the third microelectronic element, the central region being positioned a middle third of the way between the edge and the second edge of the third microelectronic element. Third leads may connect the bond pads on the third microelectronic element with at least some of the third conductive elements. In one embodiment, the third leads are wire bonds.

In another embodiment, the surfaces of the second and third microelectronic elements are positioned on the same plane. In a particular embodiment, the microelectronic assembly can also include a buffer element electrically connected to at least some of the terminals and one or more of the microelectronic elements in the package. The buffer element can be configured to regenerate at least one signal received at a terminal of the microelectronic assembly. The third microelectronic element may overlie at least a portion of the second microelectronic element.

In another embodiment, a system includes one of the foregoing embodiments of an assembly and one or more other electronic components electrically connected to the assembly. The system may further include a housing, where the assembly and the other electronic components are mounted to the housing.

BRIEF DESCRIPTION OF THE DRAWINGS

FIG. 1 is top plan view of an embodiment of the present invention.

FIG. 1B is a bottom plan view of a microelectronic element in the embodiment of FIG. 1.

FIG. 1C is a bottom plan view of another microelectronic element in the embodiment of FIG. 1.

FIG. 4 is top plan view of an alternative embodiment of the present invention.

FIG. 10 is plan view of an alternative embodiment of the present invention.

FIG. 16 is a top plan view of an alternative embodiment of the present invention.

DETAILED DESCRIPTION OF THE INVENTION

Figure 1A:
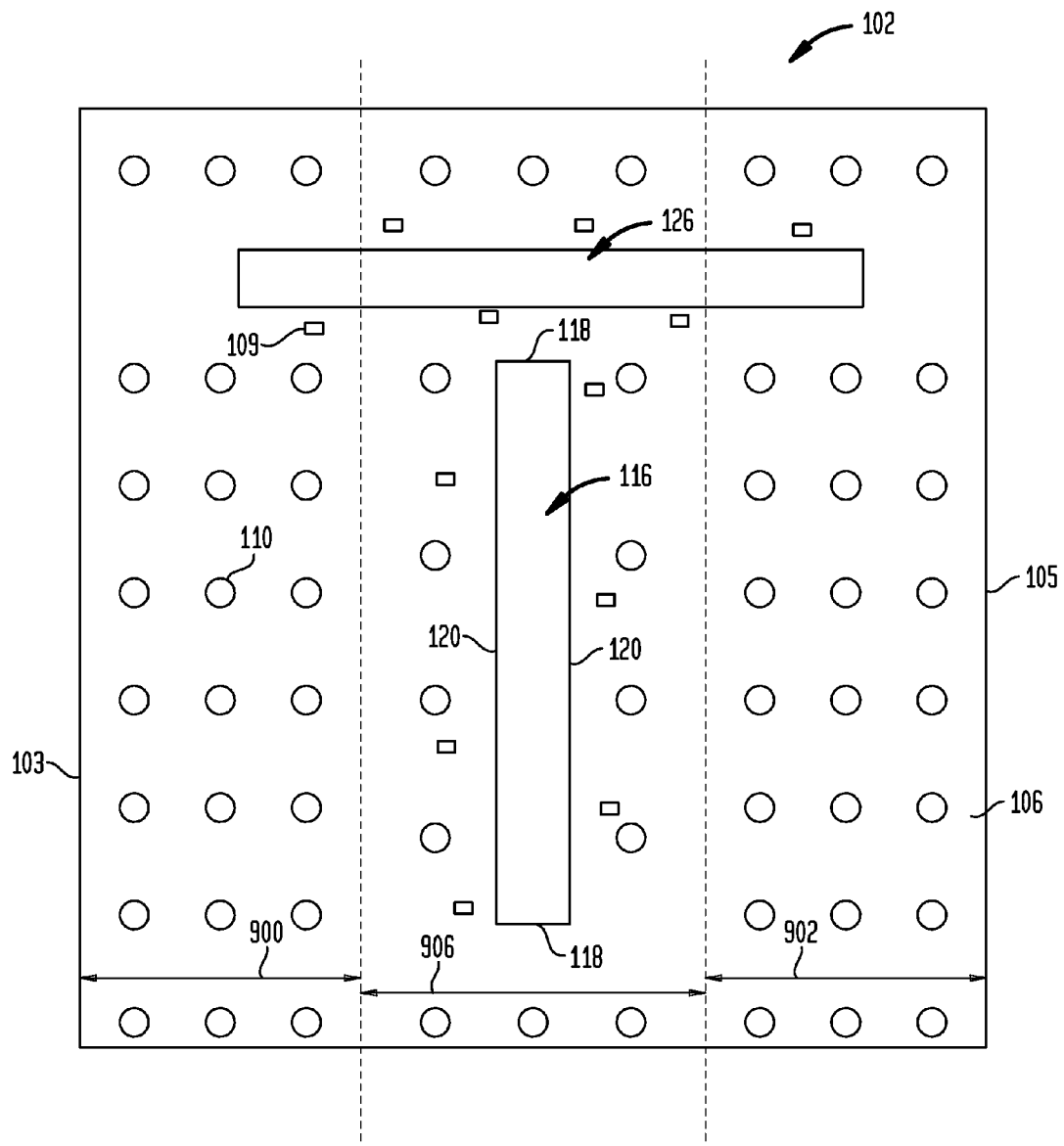
FIG. 1A is a bottom plan view of a component of the embodiment of FIG. 1.
Figure 2A:
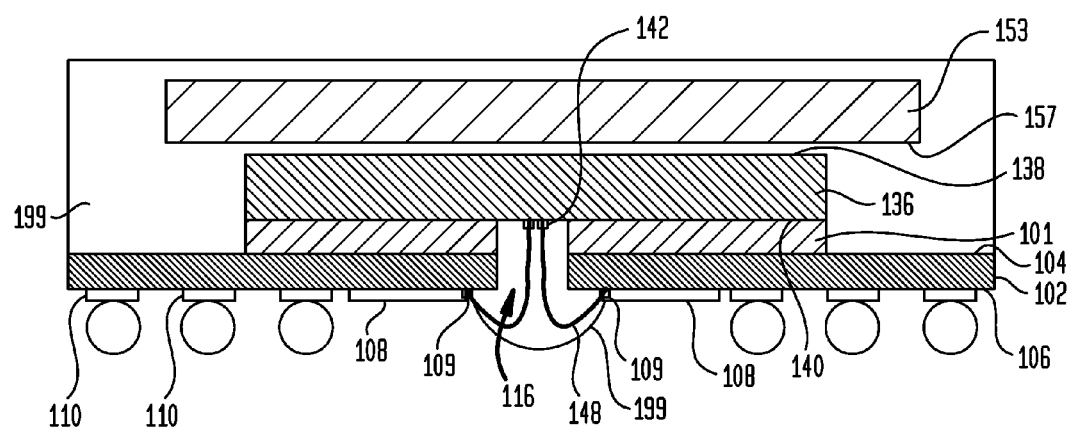
FIG. 2A is a cross-section of FIG. 1 taken through 2A-2A.
Figure 2B:
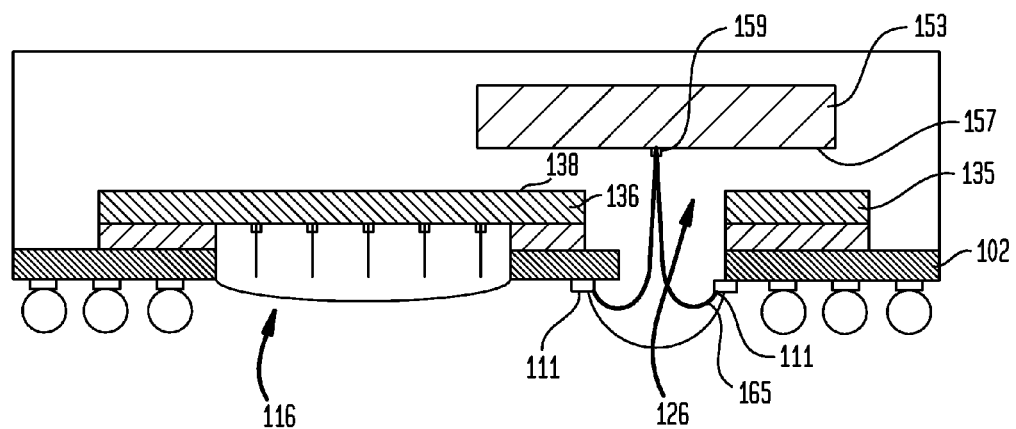
FIG. 2B is a cross-section of FIG. 1 taken through line 2B-2B.
Figure 3:
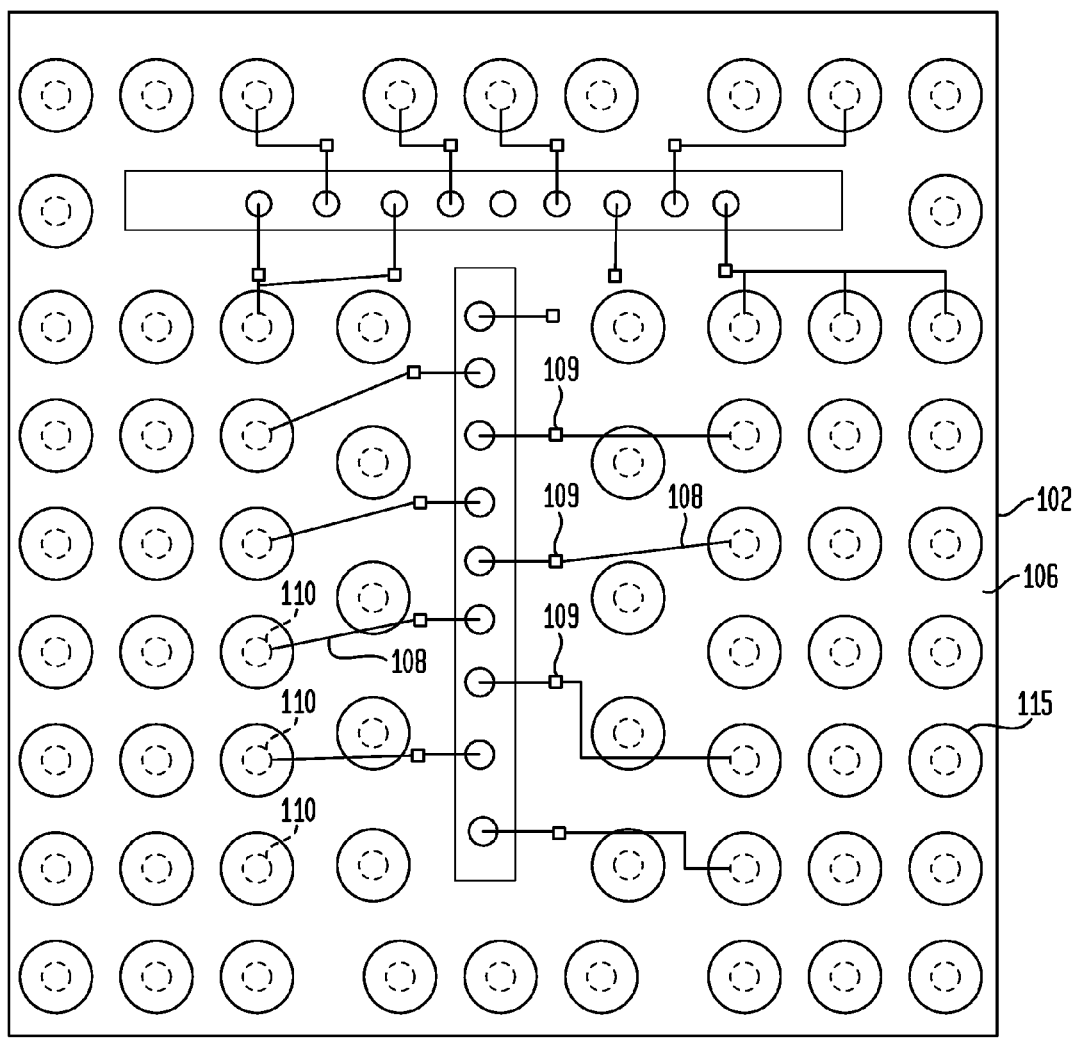
FIG. 3 is a bottom view of the embodiment shown in FIG. 1.

FIGS. 1-3 illustrate different views of a microelectronic package or microelectronic assembly 100 in accordance with an embodiment of the present invention. With reference to FIG. 1, a microelectronic assembly 100 includes two microelectronic elements overlying a substrate 102. The microelectronic elements are stacked in a face-down position, such that at least a portion of the second microelectronic element 153 overlies a rear surface 138 (FIG. 2A) of first microelectronic element 136.

The first and second microelectronic elements 136,153 may be positioned on the substrate 102 so that the outer edges (i.e., first, second, third, fourth edges 144,145,146,147) of the first microelectronic element 136 and outer edges (i.e., first, second, third, fourth edges 161,162,163,164) of the second microelectronic element 153 are positioned on the first surface 104 of the substrate 102 and do not extend beyond the peripheral edge of the substrate 102.

In particular embodiments, the substrate can be a dielectric element of various types of construction, such as of polymeric material or inorganic material such as ceramic or glass, the substrate having conductive elements thereon such as terminals and leads, e.g., traces, substrate contacts, or other conductive elements electrically connected with the terminals. In another example, the substrate can consist essentially of a semiconductor material such as silicon, or alternatively include a layer of semiconductor material and one or more dielectric layers thereof. In yet another embodiment, the substrate can be a lead frame having leads, wherein the terminals can be portions of the leads, such as end portions of the leads.

As best shown in FIGS. 2A, 2B, the substrate 102 includes a first surface 104 and a second surface 106 remote therefrom. Although the thickness of the substrate 102 will vary with the application, the substrate 102 most typically is about 10 to 100 micrometers (microns) thick. The substrate 102 may have conductive traces 108 and a plurality of contacts, such as terminal contacts 110, first set of contacts 109, and second set of contacts 111 exposed at a surface thereof. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure.

Referring to FIG. 1A, between an opposed pair of edges, the front surface 104 of the substrate 102 may include three portions which divide the width of the substrate 102 between first and second edges 103,105 of the substrate 102. The three portions, which may have the same or different widths may include: a first outer portion 900 adjacent the first edge 103 of the substrate 102, a second outer portion 902 adjacent the second edge 105 of the substrate 102, and a central portion 906 occupying the area between the first and second outer portions 900,902. In one embodiment, conductive traces 108 and the plurality of contacts are exposed at one or more of these portions on the second surface 106 of the substrate 102. In other embodiments, the conductive traces 108 and contacts may extend on both the first 104 and second 106 surfaces of the substrate 102 or within the interior of substrate 102.

Conductive traces 108 may be formed from any electrically conductive material, but most typically are formed from copper, copper alloys, gold or combinations of these materials. The thickness of the traces will also vary with the application, but typically is about 5 to 25 microns. The substrate 102 and traces 108 can be fabricated by a process such as that disclosed in co-pending, commonly assigned U.S. Pat. No. 7,462,936, the disclosure of which is incorporated by reference herein.

Referring to FIGS. 1, 1A, 2B, and 3, the substrate 102 may further include at least two apertures or openings extending between the first surface 104 and second surface 106 of the substrate 102. The first opening 116 may be positioned on the central portion 906 (FIG. 1A) of the substrate 102 and have a pair of short edges 118 and a pair of long edges 120 that have a length that is greater than the length of the short edges 118. A second opening 126 may extend in a direction transverse to the first opening 116. In this embodiment, the second opening 126 extends in a direction that is perpendicular to the first opening 116 so that the first and second openings 116,126 form the shape of a T. It is to be appreciated that the first and second openings 116, 126 may alternatively be joined together to form one continuous opening. In another alternative embodiment, the first opening 116 or second opening 126 may be comprised of a plurality of openings, such that the first opening 116 has a plurality of openings extending in one direction, and the second opening 126 has a plurality of windows extending in a direction transverse to the first opening 116. It is to be further appreciated that the openings may also take on any alternative shape or design.

Referring now to FIGS. 2A-2B, the first microelectronic element 136 has a front surface 140 that faces and can be attached to the first surface 104 of the substrate 102 using know bonding materials or techniques, such as using an adhesive 101. The first microelectronic element 136 further includes an opposed rear surface 138 remote from its front surface 140. In this embodiment, the front surface 140 is a first surface of the microelectronic element 136, having bond pads 142 thereon, and the rear surface 138 is a rear surface thereof. In this embodiment, opposed first and second edges 144, 145 and opposed third and fourth edges 146, 147 of the first microelectronic element 136 extend between the first surface 104 and second surface 106 of the substrate 102. The edges of the first microelectronic element 136 may be of equal or different lengths.

Turning to FIG. 1B, the first microelectronic element 136 may be any type of semiconductor chip. In this embodiment, the first microelectronic element 136 can be a DRAM (dynamic random access memory) chip having conductive elements thereon. As shown, the surface area of the front surface 140 of the first microelectronic element 136 may be divided into three regions having substantially equal widths in a direction between the first and second edges of the first microelectronic element: a first outer region 920, a second outer region 922, and a central region 924 positioned between the first outer region 920 and second outer region 922. For example, if the length between the long edges is 6 microns, the respective lengths of the first outer, second outer, and central regions may be 2 microns. The central region 924 would therefore be positioned 2 microns from the first edge 144 and 2 microns from the second edge 145. In other words, the central region can be positioned in the middle third of the first microelectronic element 136.

As is typical with regard to DRAM chips, the conductive elements may include first bond pads 142 that extend along the central region 924 of the front surface 140 of the first microelectronic element 136. The conductive elements provide for an electrical connection between the first microelectronic element 136 and the first set of contacts 109 positioned on the second surface 106 of the substrate 102. An adhesive 101 can be used to attach the first microelectronic element 136 to the substrate 102.

Referring to FIGS. 2A and 2B, the bond pads 142 of the first microelectronic element 136 may be positioned directly over the first opening 117 of the substrate 102. This allows the bond pads 142 to be exposed through the first opening 117. The bond pads 142 may be electrically connected to a first set of contacts 109 on the second surface 106 of the substrate 102 using any known methods of establishing an electrical connection. In one embodiment, bond wires 148 can extend from the bond pads 142 on the first microelectronic element 136, through the first opening 116, and to the first set of contacts 109 on the second surface 106 of the substrate 102. Traces 108 (FIG. 3) can be used to connect the first set of contacts 109 to terminal contacts 110.

The second microelectronic element 153 may be similar to the first microelectronic element 136. A front surface 157 of the second microelectronic element having bond pads thereon, faces the first microelectronic element 136, such that the second microelectronic element 153 overlies the rear surface 138 of the first microelectronic element 136. As shown in FIG. 1C, in this embodiment, the second microelectronic element 153 has opposed first and second edges 161,162 and opposed third and fourth edges 163,164 extending between the rear surface 155 and front surface 157 of the second microelectronic element 153 and adjacent first and second edges 161,162. Conductive elements, such as bond pads 159, extend along the front surface 157 of the second microelectronic element 153. In this embodiment, the second microelectronic element 153 may be a semiconductor chip, such as a DRAM chip, with bond pads 159 positioned along a central region 932 of the second microelectronic element 153, which is positioned between a first outer region 928 and a second outer region 930. In one embodiment, bond pads 159 can extend in a direction transverse to the direction bond pads 142 on the first microelectronic element 136 extend.

Turning to FIG. 2B, The second microelectronic element 153 may be positioned above the first microelectronic element 136. As shown, a spacer 135 may be positioned between the substrate 102 and the second microelectronic element 153 to support the second microelectronic element 153 at a height above the first microelectronic element 136. As best seen in FIG. 1, the first and second edges 161,162 of the second microelectronic element 153 may extend in a direction that is transverse to the first and second edges 144,145 of the first microelectronic element 136. As a result, the first and second edges 161,162 of the second microelectronic element 153 extend beyond one of the third and fourth edges 146,147 of the first microelectronic element 136.

Referring to FIG. 2B, bond pads 159 on the second microelectronic element 153 may be electrically connected with a second set of contacts 111 of the plurality of contacts exposed at the substrate 102.

Conductive elements may be used to electrically connect the bond pads 159 on the first microelectronic element 136 with a second set of contacts 111 on the second surface 106 of the substrate 102. In this embodiment, bond wires 165 may be used to connect the bond pads 159 on the second microelectronic element 153 with the second set of contacts 111 (FIGS. 2B-3) on the second surface 106 of the substrate 102. As shown, bond wires 165 extend through the second opening 126 and connect to the second set of contacts 111.

Referring to FIG. 3, an array of solder balls 115 may be attached to terminal contacts 110 (FIG. 2B) exposed at the second surface 106 of the substrate 102. As shown, traces 108 can extend from the first set of contacts 109 along the second surface 106 to provide an electrical connection between the first set of contacts 109 and terminal contacts 110 supporting the solder balls 115. As shown in FIG. 2A, once the stacked assembly is assembled, an encapsulant 199 may overlie some or all of the first surface 104 of the substrate 102, and the first and second microelectronic elements 136,153, and may cover bond wires 148,165 extending through the respective first opening 116 and second opening 126.

The remaining embodiments, discussed herein, are substantially similar to the embodiment of FIGS. 1-3. Each differ only with respect to the way in which microelectronic elements are positioned in a front surface or face-down position over a substrate and the respective openings in the substrate. The principles disclosed regarding the embodiment of FIGS. 1-3 are therefore equally applicable to the remaining embodiments disclosed herein. Accordingly, similar reference numerals will be used to describe similar elements.

Figure 5A:
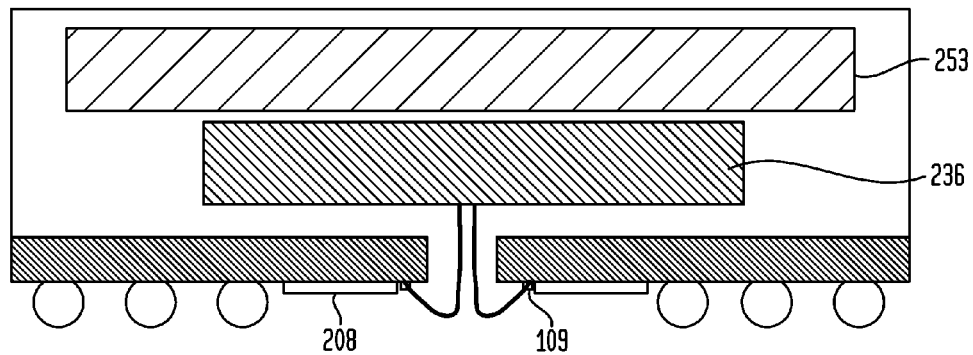
FIG. 5A is a cross-section of FIG. 4 taken through line 5A-5A.
Figure 5B:
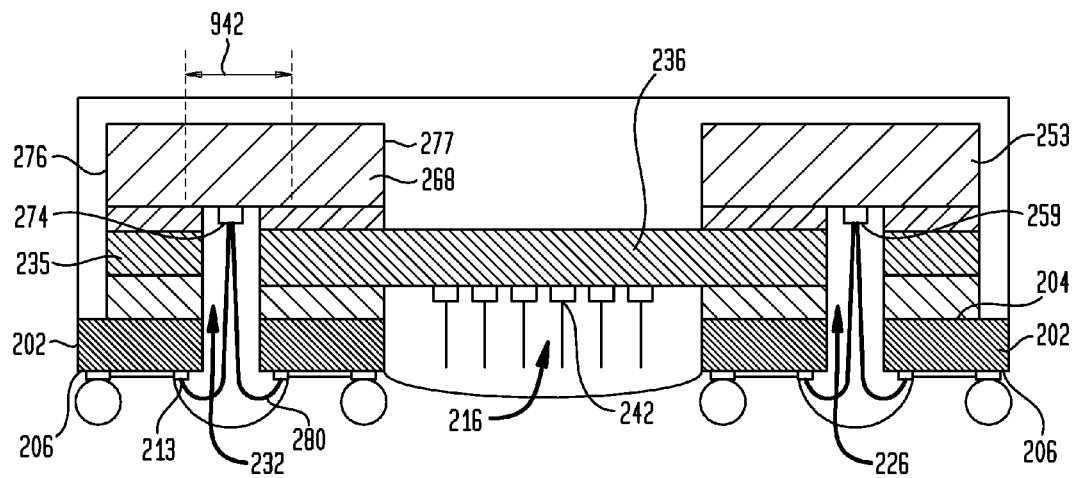
FIG. 5B is a cross-section of FIG. 4 taken through line 5B-5B.
Figure 5C:
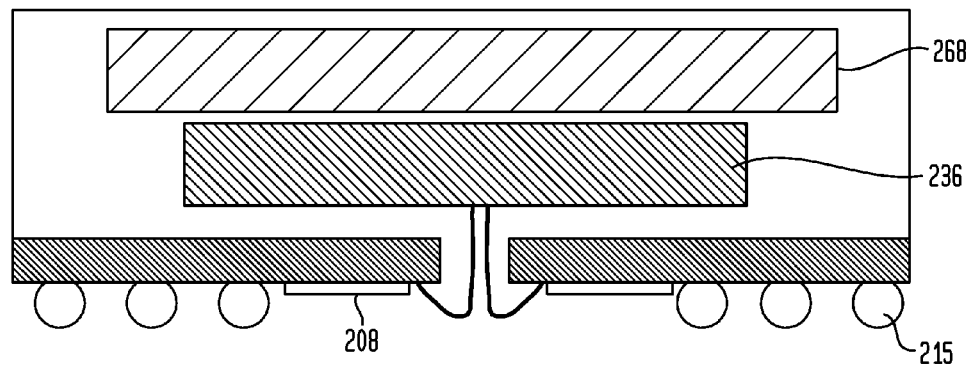
FIG. 5C is a cross-section of FIG. 4 taken through line 5C-5C.
Figure 6:
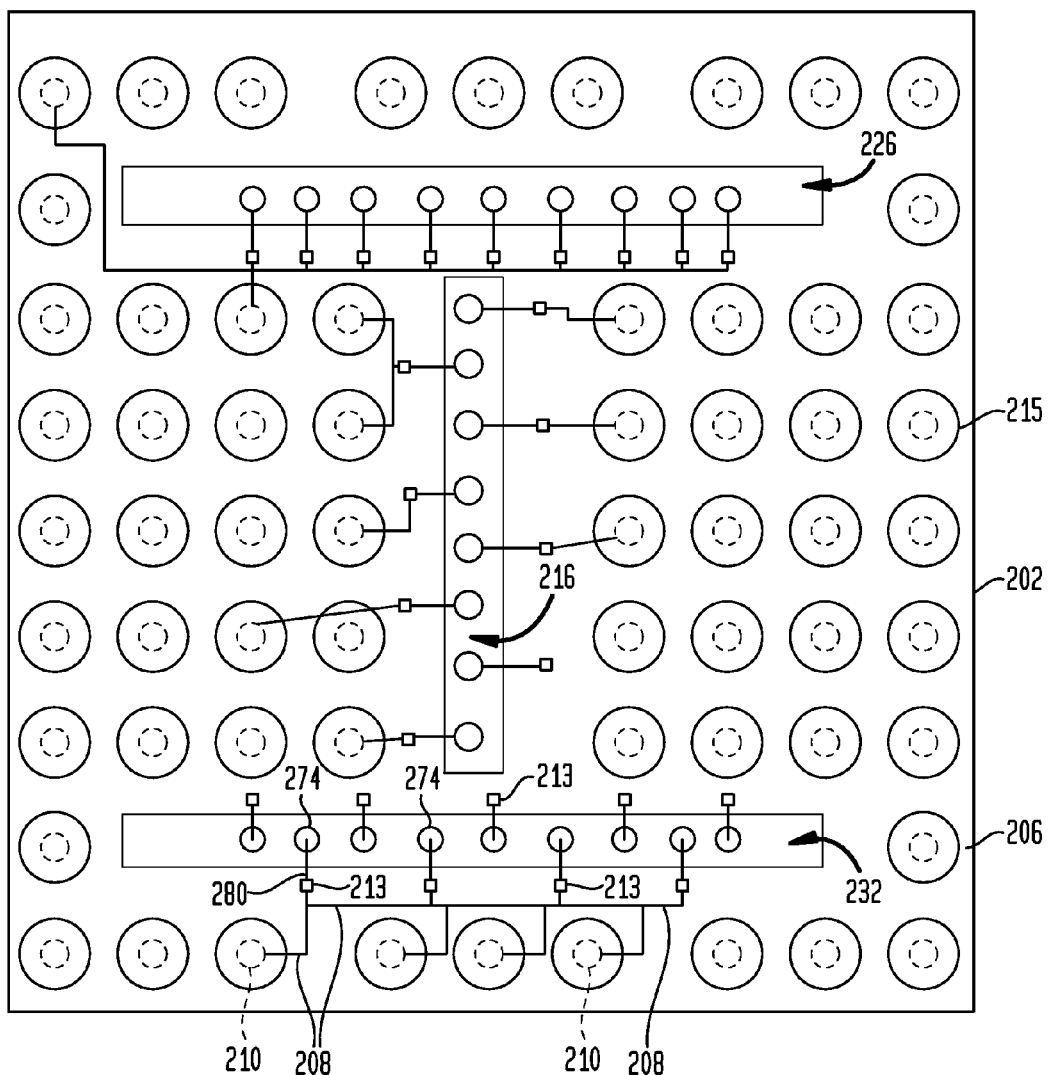
FIG. 6 is a bottom view of FIG. 4.

FIGS. 4-6 illustrate an alternative stacked microelectronic assembly 200 that includes three stacked microelectronic elements in a front face-down position. As best shown in FIGS. 5A and 5B, both a second microelectronic element 253 and third microelectronic element 268 may overlie the first microelectronic element 236.

As best shown in FIGS. 4 and 5B, the substrate 202 has a first surface 204 and second surface 206, as well as three openings extending between the first and second surfaces 204,206. As in the previous embodiment, the first opening 216 has a first end 222 and a second end 224 and may be positioned in the central portion of the substrate 202, which is also a middle one-third of the substrate 202 between the first edge 203 and opposed second edge 205 of the substrate. The first opening 216 includes short edges 218 at its first end 222 and second end 224. The second opening 226 may be positioned adjacent the first end 222 of the first opening 216. A third opening 232 may be positioned adjacent the second end 224 of the first opening 216, so that the long edges 234 of the third opening 232 extend in a direction that is transverse to the direction in which the long edges 220 of the first opening 216 extend. In this configuration, the second and third openings 226,232 can be parallel to one another and also perpendicular to the first opening 216, so as to form the shape of an I. Alternatively, the first, second, and third openings 216,226, 232 may be joined together such that they form one continuous opening. As in previous embodiments, one or more of the first, second, or third openings 216,226,232 may be comprised of a plurality of openings.

The first and second microelectronic elements 236,253 are stacked in an arrangement similar to the embodiment of FIGS. 1-3 and differ to the extent that a third microelectronic element 268 is included in the assembly. Referring to FIGS. 5A and 5B, the first microelectronic element 236 and second microelectronic element 253 lie in different planes. As better shown in FIG. 5B, a third microelectronic element 268 may be positioned adjacent the first and second microelectronic elements 236,253. In this embodiment, the third microelectronic element 268 lies in the same plane as the second microelectronic element 253, but not in the same plane as the first microelectronic element 236. As shown, one or more spacers 235 can be used to support the third microelectronic element 268 above the first microelectronic element 236, such that the second edges 277 of the third microelectronic element 268 overlies or overlaps the fourth edge 247 of the first microelectronic element 236, and portions of the respective first and second edges 244,245 of the first microelectronic element 236. Bond pads 274 on the third microelectronic element 268 extend along a portion of the central region 942 of the third microelectronic element 268 (FIGS. 5B,6) and face the third opening 232. As in the previously disclosed embodiment, the central region 942 can be positioned on the middle third of the length between the first and second edges 276,277 of the third microelectronic element 268. Bond pads 274 on the third microelectronic element 268 may be aligned and exposed through the third opening 232.

Conductive connections may be used to connect each of the bond pads on the respective microelectronic elements with respective sets of contacts on the bottom surface of the substrate. For example, as shown, bond wires 280 connect bond pads 274 exposed at the surface of the third microelectronic element 268 with a third set of contacts 213 on the second surface 206 of the substrate 202. Referring to FIG. 6, conductive traces 208 may then electrically connect each of the bond pads 274 on the third microelectronic element 268 with the terminal contacts 210 which support the solder balls.

As with respect to the previous embodiment, the arrangement of the first, second, and third microelectronic elements 236,253,268 allows for each of the respective bond pads 242,259,274 (FIG. 5B) of the respective first, second and third microelectronic elements 236,253,268 to be aligned with the respective first, second, and third openings 216,226, 232. This, in turn, allows for conductive connections to pass within or through the first, second and third openings 216, 226,232 without interference from adjacent conductive connections. Additionally, this allows for the stacking of two or more chips having bond pads positioned on a central region of the chip.

Figure 7:
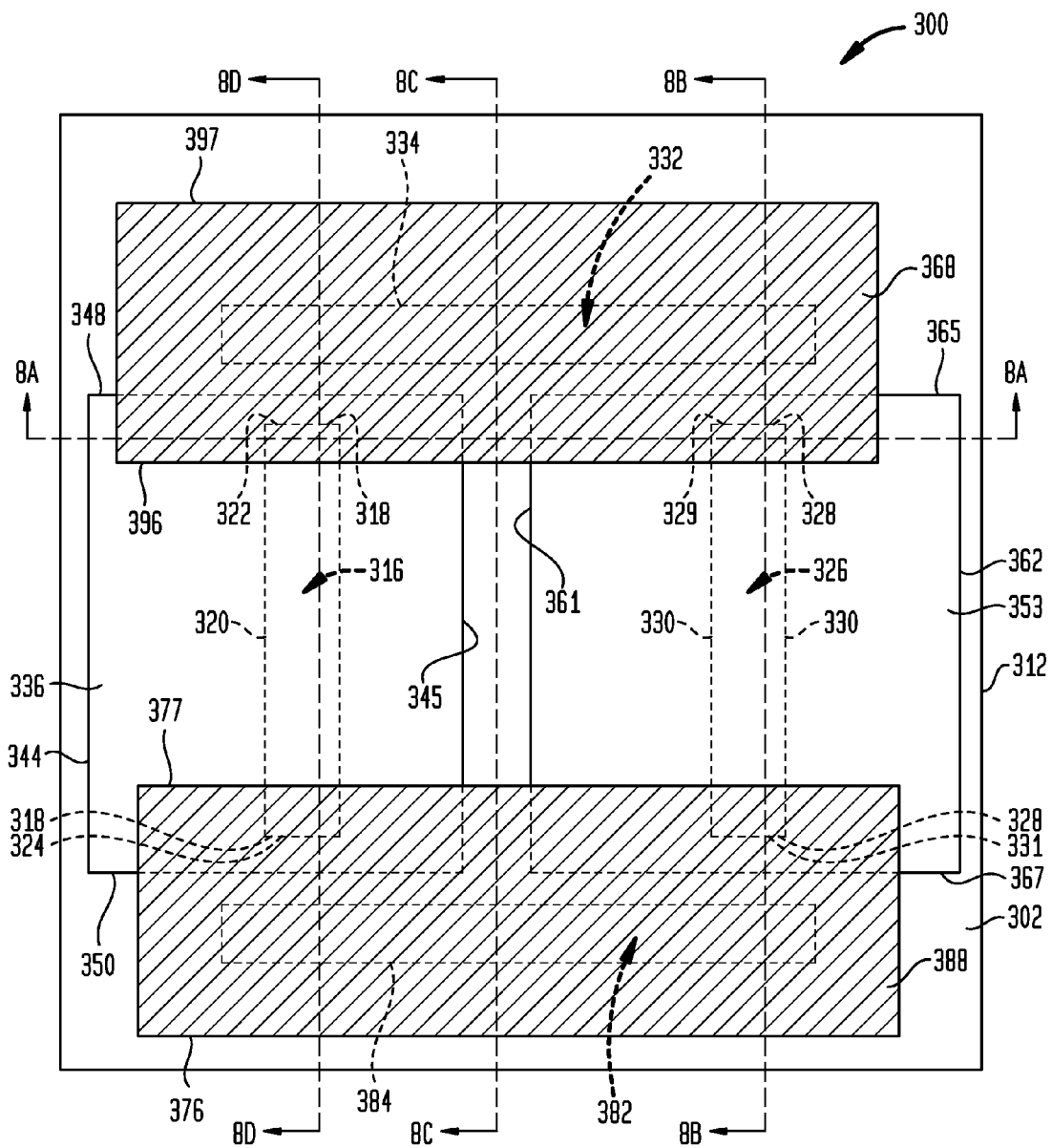
FIG. 7 is plan view of an alternative embodiment of the present invention.
Figure 8A:
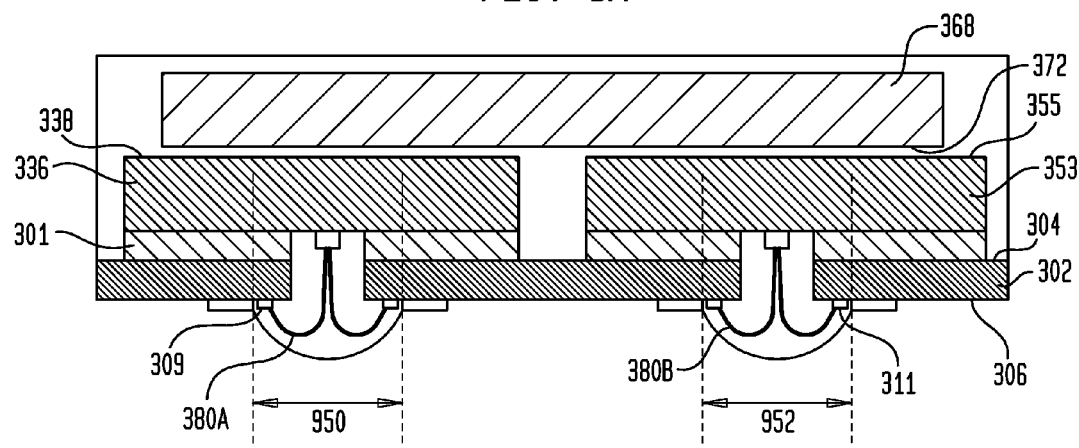
FIG. 8A is a cross-section of FIG. 7 taken through line 8A-8A.
Figure 8B:
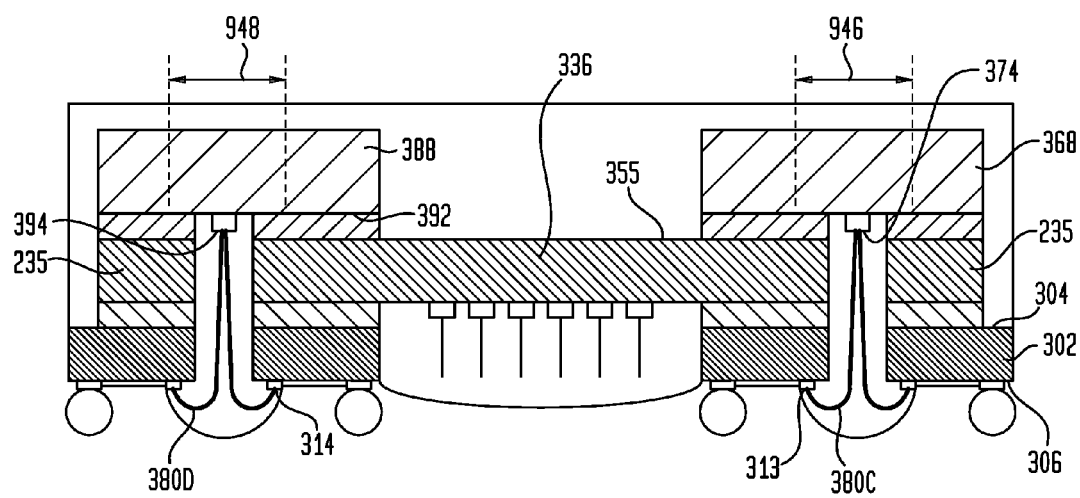
FIG. 8B is a cross-section of FIG. 7 taken through line 8B-8B.
Figure 8C:
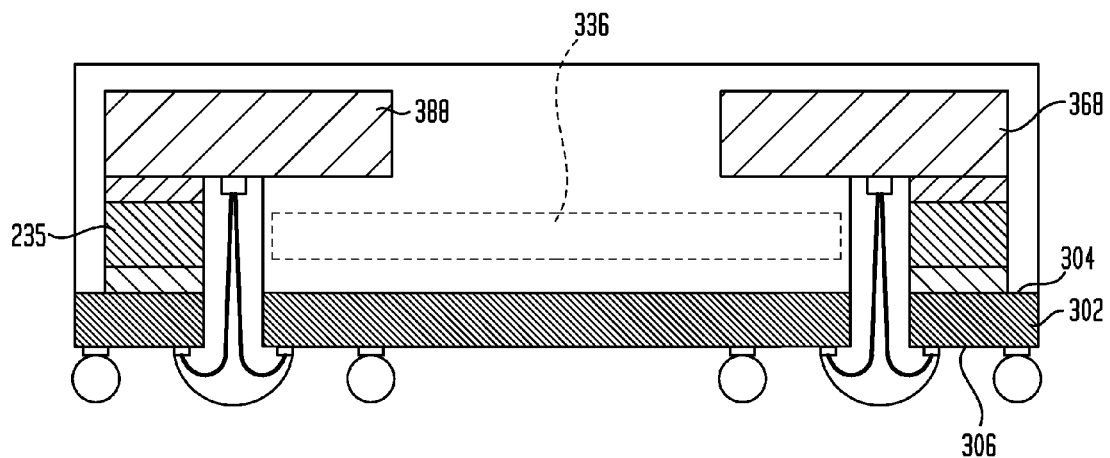
FIG. 8C is a cross-section of FIG. 7 taken through line 8C-8C.
Figure 8D:
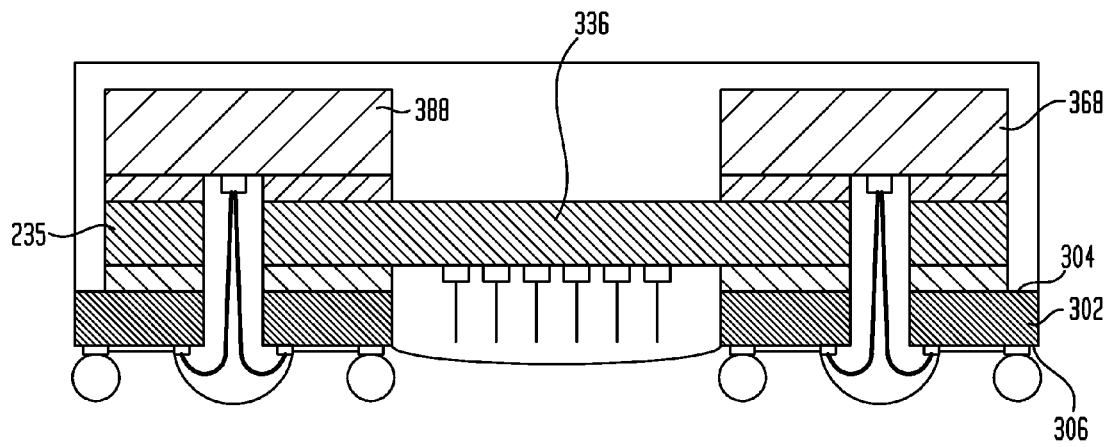
FIG. 8D is a cross-section of FIG. 7 taken at line 8D-8D.
Figure 9:
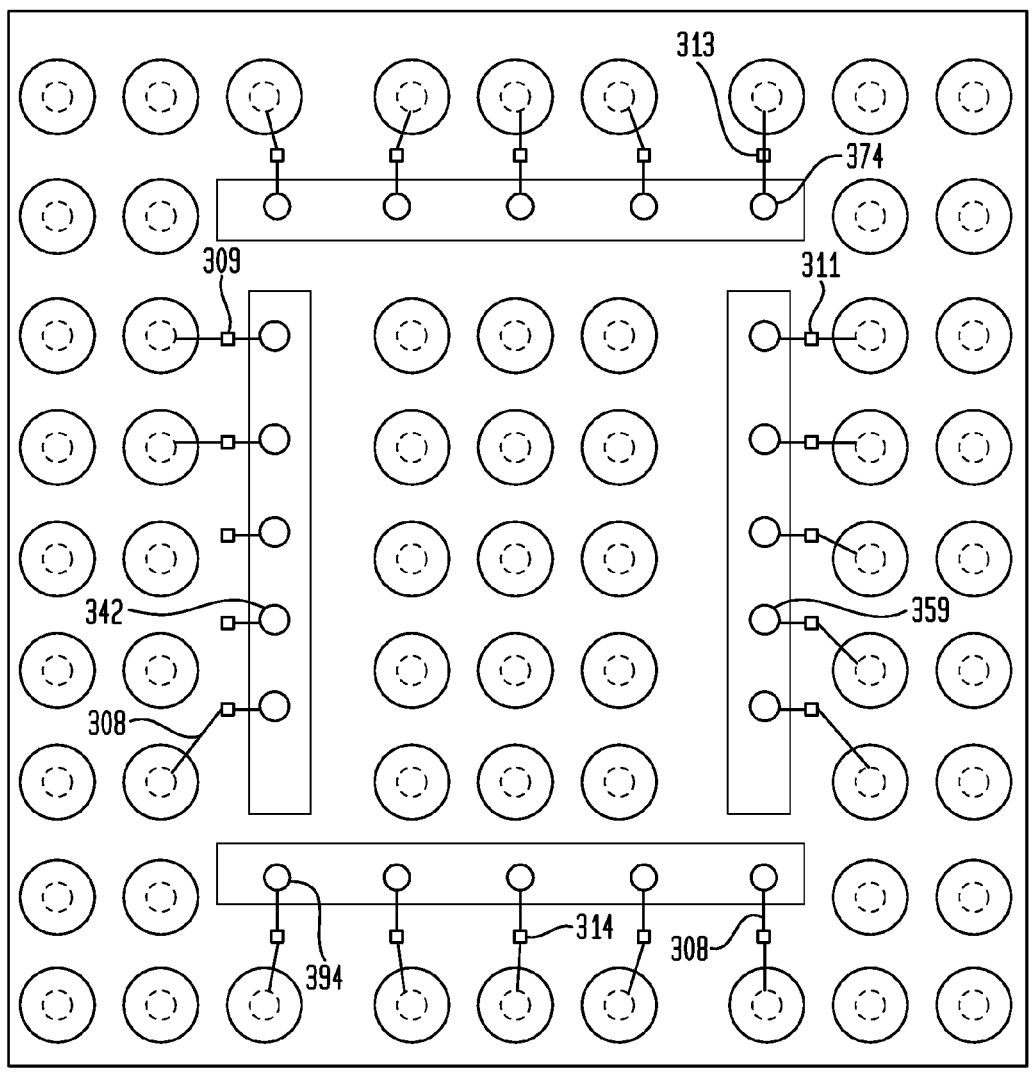
FIG. 9 is a bottom view of FIG. 7.

Referring now to FIGS. 7-9, another embodiment is shown illustrating a microelectronic assembly 300 that includes four stacked microelectronic elements overlying a substrate in a face-down position. In this embodiment, four openings extend through the first and second surfaces 304,306 of the substrate 302. As best shown in FIG. 7, the first and second openings 316,326 are positioned in directions that are perpendicular to the third and fourth openings 332,382. The first opening 316 has long edges 320 and short edges 318, wherein the short edges 318 are located at a first end 322 and a second end 324 of the first opening 316. The second opening 326 also has a pair of short edges 328 and a pair of long edges 330, wherein the short edges 328 are located at a first end 329 and a second end 331 of the second opening 326, 326. The third opening 332 is located adjacent the respective first ends 322, 329 of the first and second openings 316,326, whereas the fourth opening 382 is located adjacent the respective second ends 324,331 of the first and second openings 316,326. In this embodiment, the respective long edges 334,384 of the third and fourth openings 332,382 are not aligned with the long edges 320,330 of the respective first and second openings 316,326. As shown, the first and second openings 316, 326 are spaced further away from the outer peripheral edge 312 of the substrate 302 than the third and fourth openings 332, 382.

Referring to FIGS. 7-8C, the first and second microelectronic elements 336,353 may be attached to the substrate 302 using known materials, such as an adhesive 301 or the like, so that the front surface 340 of the first microelectronic element 336 and front surface 357 of the second microelectronic element 353 are positioned directly over the first surfaces 304 of the substrate 302. Bond pads 342 on the first microelectronic element 336 may also be positioned over the first opening 316 and bond pads 359 on the second microelectronic element 353 may be positioned over the second opening 326. As shown, the first and second edges 344,345 of the first microelectronic element 336 and the first and second edges 361,362 of the second microelectronic element 353 are parallel to one another, and extend in the same direction.

The third and fourth microelectronic elements 368,388 may be positioned over the substrate 302, as well as the first and second microelectronic elements 336,353. As best shown in FIGS. 7 and 8A, the front surface 372 of the third microelectronic element 368 overlies the rear surfaces 338,355 of the first and second microelectronic elements 336, 353. Similarly, the front surface 392 of the fourth microelectronic element 388 overlies the rear surfaces 338,355 of the respective first and second microelectronic elements 336,353. Spacers 235 (FIGS. 8A,8B) may be used to support the portions of the third microelectronic element 368 and fourth microelectronic element 388 that face the first surface 304 of the substrate 302, but do not overlie the first and second microelectronic elements 336,353.

As shown in FIGS. 7 and 8B-8D, the third microelectronic element 368 is adjacent the respective first ends 348,365 of the first and second microelectronic elements 336,353. The fourth microelectronic element 388 is adjacent the second ends 350,367 of the respective first and second microelectronic elements 336,353. Additionally, the respective first and second edges 376,377 of the third microelectronic element 368 and first and second edges 396,397 of the fourth microelectronic element 388 extend in a direction that is perpendicular to both the respective first and second edges 344,345 of the first microelectronic element 336 and first and second edges 361,362 of the second microelectronic element 353. Consequently, referring to FIG. 9, the bond pads 374 extending along central region 946 (FIG. 8B) of the third microelectronic element 368 and the bond pads 394 extending along the central region 948 (FIG. 8B) of the fourth microelectronic element 388 will extend in a direction that is perpendicular to the respective bond pads 342,359 positioned near the respective central regions 950, 952 of the first and second microelectronic elements 336, 353.

The orientation of the respective microelectronic elements over the substrate 302 allows for an electrical connection between the bond pads 342(FIG. 8D), 359(FIG. 8B), 374, 394 of the first, second, third, and fourth microelectronic elements 336,353,368,388 to the respective first, second, third, and fourth sets of contacts 309,311,313,314 on the second surface 306 of the substrate 302. The electrical connection can be within or through the first, second, third, and fourth openings 316,326,332,382. In this embodiment, bond wires 380A, 380B(FIG. 8A), 380C, 380D(FIG. 8B) extending from the respective first, second, third, and fourth microelectronic elements 336,353,368,388 extend through the first, second, third, and fourth openings 316,326,332,382, and connect to respective first, second, third, and fourth sets of contacts 309,311,313,314 on the substrate (FIGS. 8A,8B).

As shown in FIG. 9, traces 308 extending along the second surface 306 of the substrate 302 can connect the first, second, third, and fourth sets of contacts 309,311,313,314 to terminal contacts having conductive material, such as solder balls, dispersed thereon.

Figure 9A:
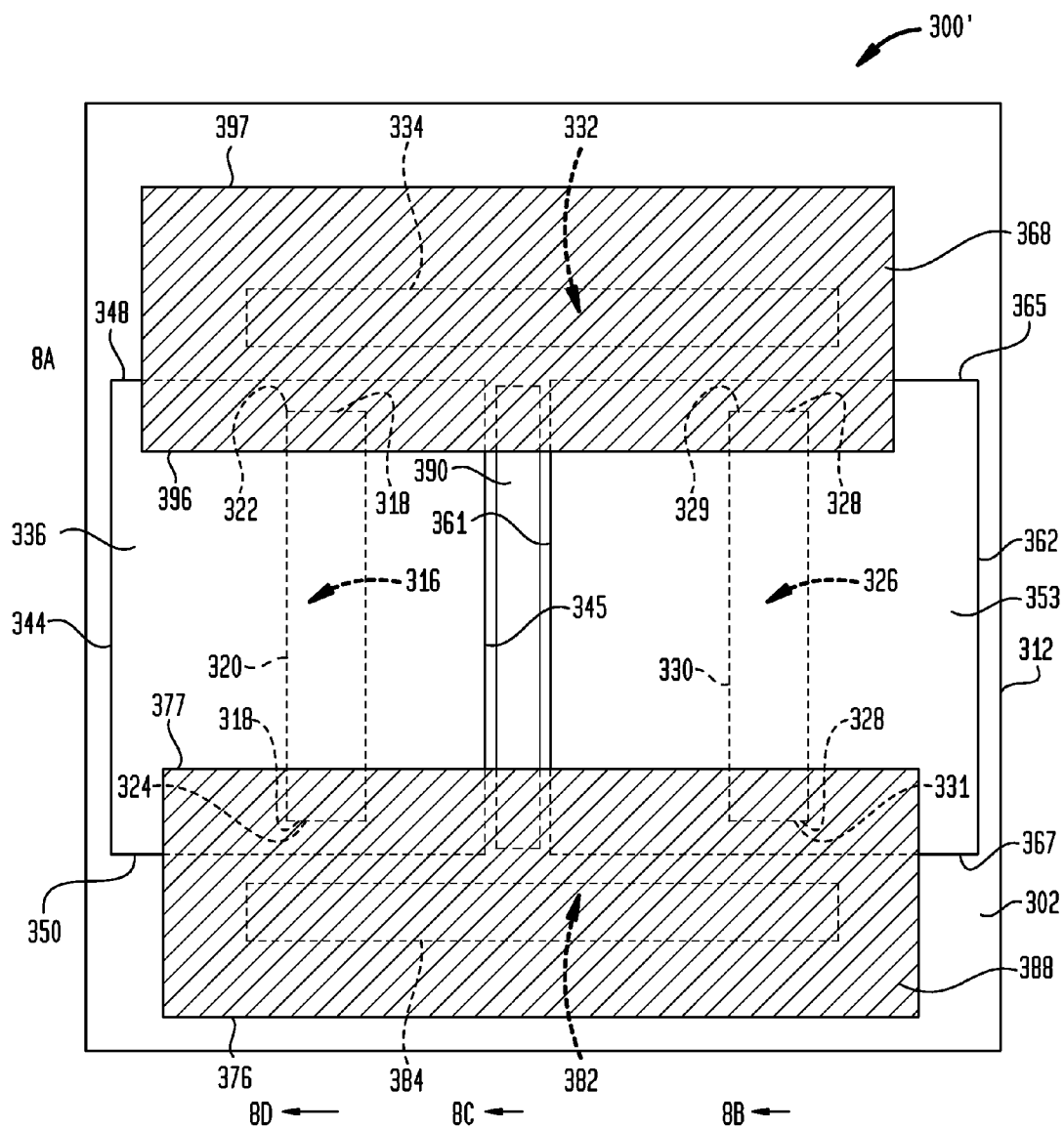
FIG. 9A is a plan view of an alternative embodiment of the present invention.
Figure 11A:
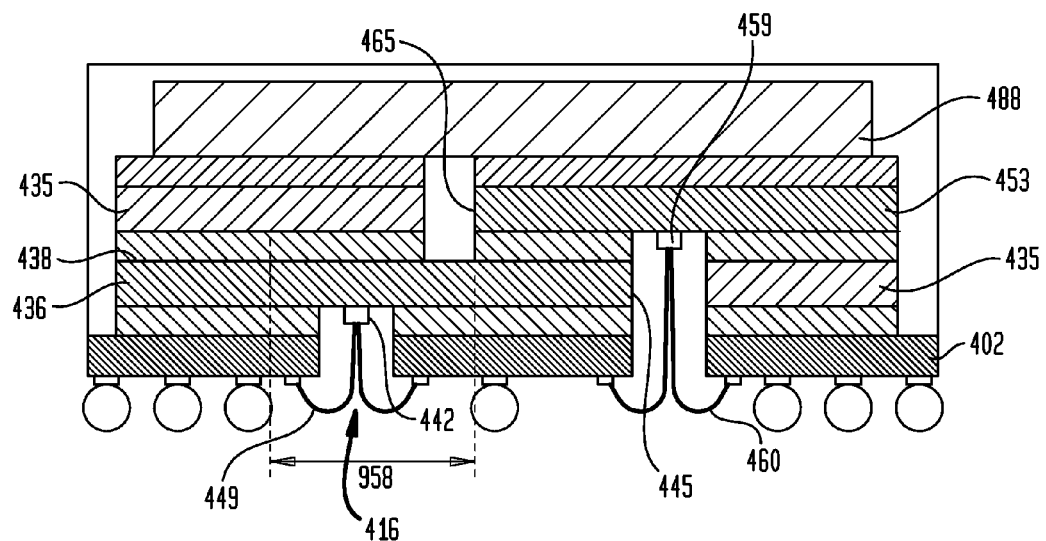
FIG. 11A is a cross-section of FIG. 10 taken through line 10A-10A.
Figure 11B:
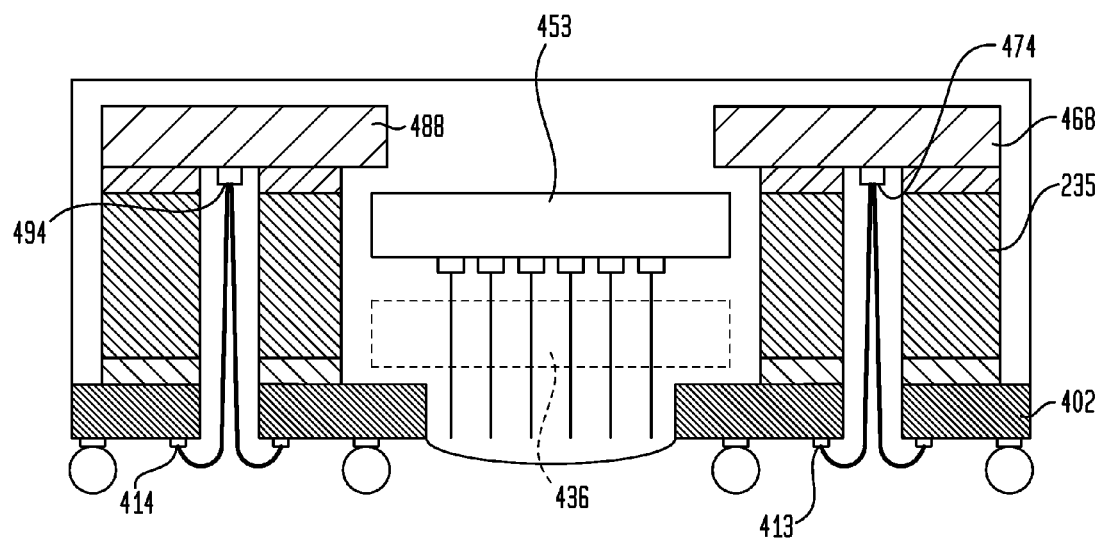
FIG. 11B is a cross-section of FIG. 10 taken through line 11B-11B.
Figure 11C:
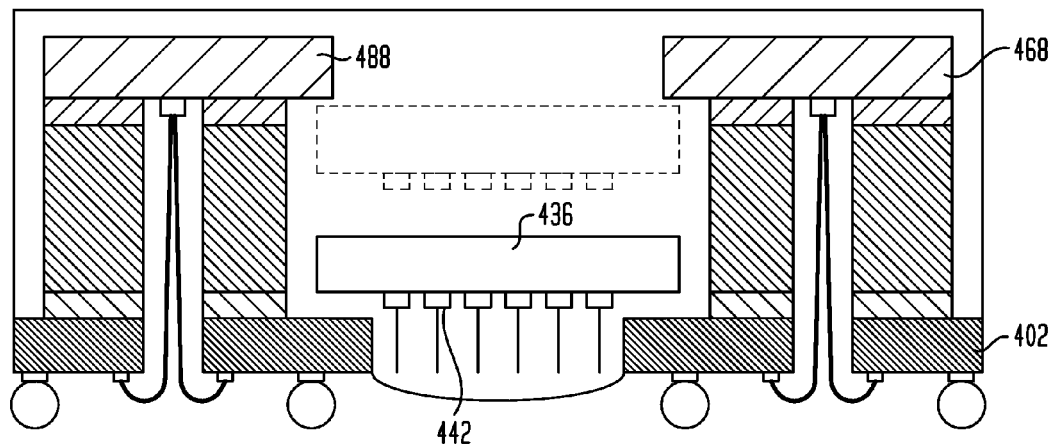
FIG. 11C is a cross-section of FIG. 10 taken through line 11C-11C.
Figure 11D:
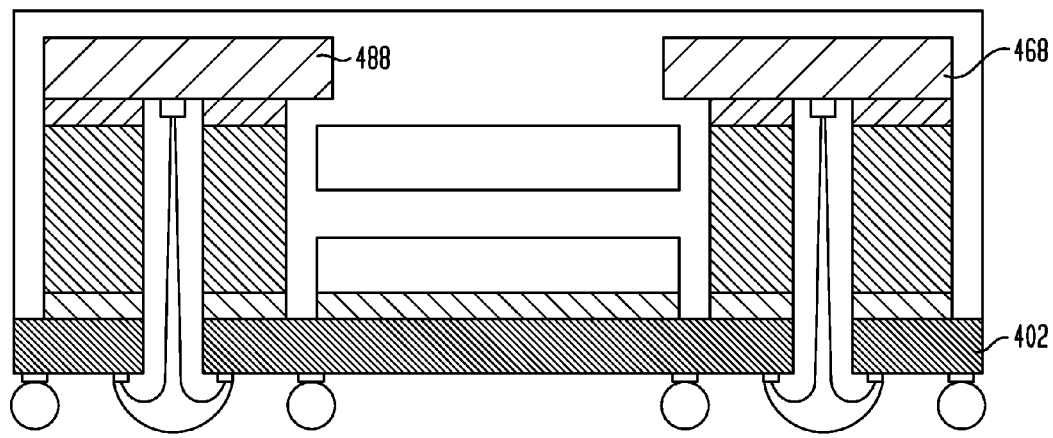
FIG. 11D is a cross-section of FIG. 10 taken through line 11D-11D.

As further shown in FIG. 9A, the microelectronic assembly 300' can further include a buffer element 390 disposed between spaced apart edges 345,361 of the microelectronic elements whose contact-bearing surfaces 340,357 are adjacent the substrate 302. In one embodiment, the buffer element 390 can regenerate at least one signal received at a terminal of the assembly from the buffer element to the first, second, third and fourth microelectronic elements 336,353,368,388 on the assembly 300'. In this case, the buffer element 390 is configured to receive signals from the terminals and regenerate the signals and transfer the regenerated signals to one or more of the microelectronic elements on the assembly 300'. One benefit of such configuration is providing isolation between the microelectronic elements in the assembly 300' and a circuit panel connected thereto, such that interconnect stubs on the assembly are electrically isolated from the corresponding signal lines on the circuit panel. In such way, signal reflections caused by improperly terminated stubs within the assembly can be avoided.

Figure 12:
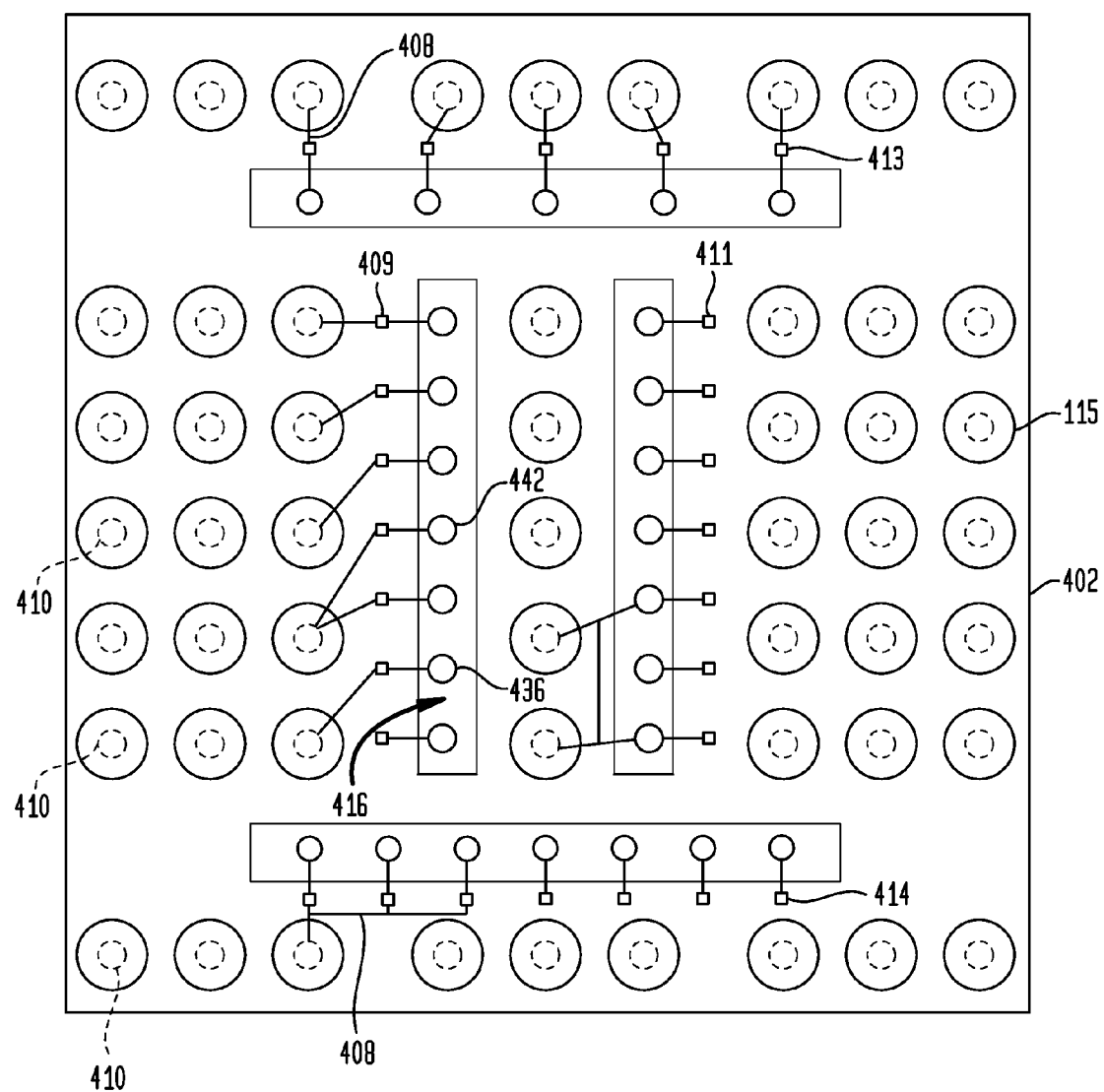
FIG. 12 is a bottom view of FIG. 10.

Referring now to FIGS. 10-12, an alternative embodiment of a stacked assembly 400 that includes center bonded microelectronic elements in a face-down position is shown. Referring first to FIGS. 10 and 11A, this embodiment differs to the extent that although the first and second microelectronic elements 436,453 are adjacent one another, they do not lie in the same plane. As in the previous embodiments, the first microelectronic element 436 is in a face-down position so that bond pads 442 extending along a central region 958 (FIG. 11A) or middle third between first edge and second edge of the first microelectronic element 436 are exposed through the first opening 416 (FIGS. 11A and 12) of the substrate 402. The second microelectronic element 453 is positioned to overlie at least a portion of the first microelectronic element 436. As best seen in FIG. 11A, the first edge 465 of the second microelectronic element 453 overlies a portion of the second edge 445 of the rear surface 438 of the first microelectronic element 436. The third and fourth microelectronic elements 468,488 are then positioned to overlie both the first and second microelectronic elements 436,453, as discussed in previous embodiments. FIGS. 11B-11D further illustrate different views of the assembly that appear similar to those of FIGS. 7-9.

As in the previous embodiments, bond wires can be used to connect bond pads on the respective microelectronic elements with contacts on the substrate. Bond wires 449 on the first microelectronic element 436 extend from the bond pads 442 on the first microelectronic element 436, through a first opening 416 in the substrate 402 and to a first set of contacts 409 on the substrate 402. Bond wires 460 on the second microelectronic element 453 extend from bond pads 459 through a second opening 426 and connect to a second set of contacts 411 on the substrate 402. Bond wires 475 on the third microelectronic element 468 extend from the bond pads 474 through the third opening 432 and connect to a third set of contacts 413 on the substrate 402. As shown in FIG. 12, traces 408 can be used to connect each of the sets of contacts 409, 411, 413, 414 to terminal contacts 410 on the substrate 402.

Figure 13:
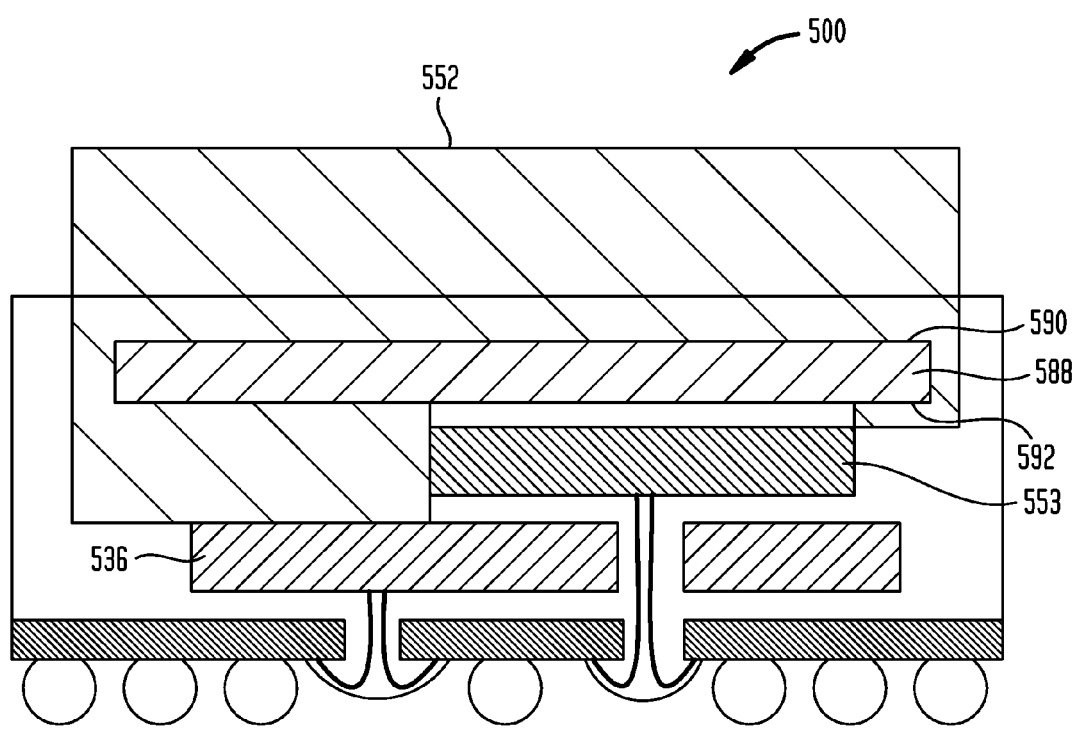
FIG. 13 is plan view of an alternative embodiment of the present invention.

Turning to FIG. 13, in an alternative embodiment of FIGS. 10-12, a microelectronic assembly 500 further includes a heat spreader 552 in thermal communication with the rear surface 590 and a portion of the front surface 592 of the fourth microelectronic element 588. The heat spreader 552 may also extend between the first and second microelectronic elements 536,553 to help distribute heat evenly within the arrangement of stacked microelectronic elements. The heat spreader 552 may also improve heat dissipation to the surrounding environment. The heat spreader 552 may be partly or entirely made of any suitable thermally conductive material. Examples of suitable thermally conductive material include, but are not limited to, metal, graphite, thermally-conductive adhesives, e.g., thermally-conductive epoxy, a solder, or the like, or a combination of such materials. In one example, the heat spreader 552 can be a substantially continuous sheet of metal. In a particular embodiment, a pre-formed heat spreader 552 made of metal or other thermally conductive material may be attached to or disposed on the rear surface 590 of the fourth microelectronic element 588 such as with a thermally conductive material such as a thermally conductive adhesive or a thermally conductive grease. The adhesive, if present, can be a compliant material which permits relative movement between the heat spreader and the microelectronic element to which it is attached, such as to accommodate differential thermal expansion between the compliantly attached elements. The heat spreader 552 may also contact third microelectronic element 568 (not shown), a first surface of the first microelectronic element 536, and a portion of the second microelectronic element 553. The heat spreader 552 may be a monolithic structure. Alternatively, the heat spreader 552 may include multiple spreader portions spaced apart from one another. In a particular embodiment, the heat spreader 552 may be or include a layer of solder joined directly to at least a portion of a rear surface of one or more of the first, second, third, and fourth microelectronic elements 536,553,568,588.

It is to be appreciated that although the prior embodiments disclosed stacked microelectronic assemblies incorporating center-bonded chips, it is possible to also incorporate into any of the foregoing microelectronic assemblies at least one chip that is not center bonded. For example, referring to FIG. 14, a stacked microelectronic assembly is shown that is substantially similar to the embodiment FIGS. 4-6. This embodiment differs to the extent that modifications are necessary to accommodate the location of the bond pads along the edge of the second microelectronic element.

Figure 14:
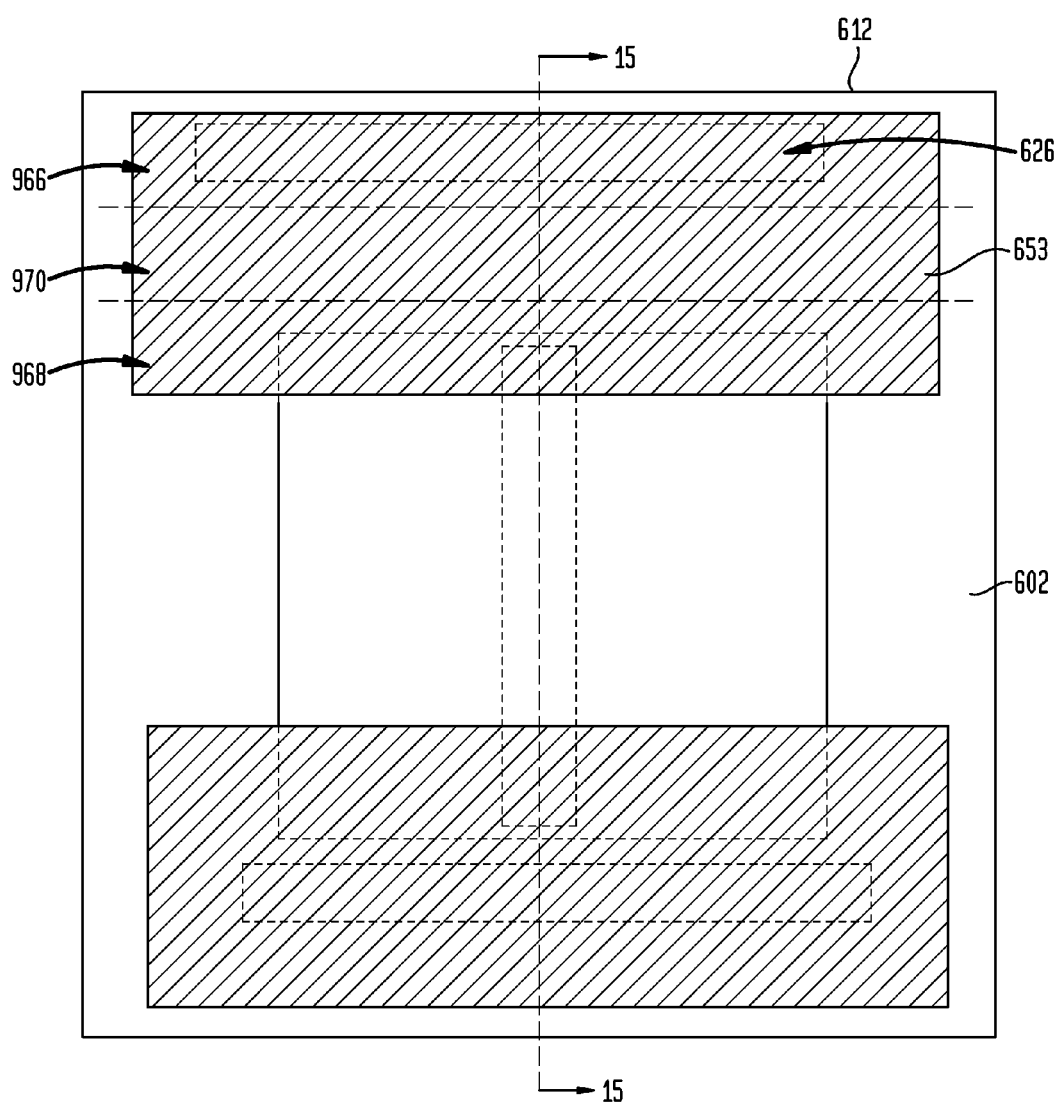
FIG. 14 is a top plan view of an alternative embodiment of the present invention.
Figure 15:
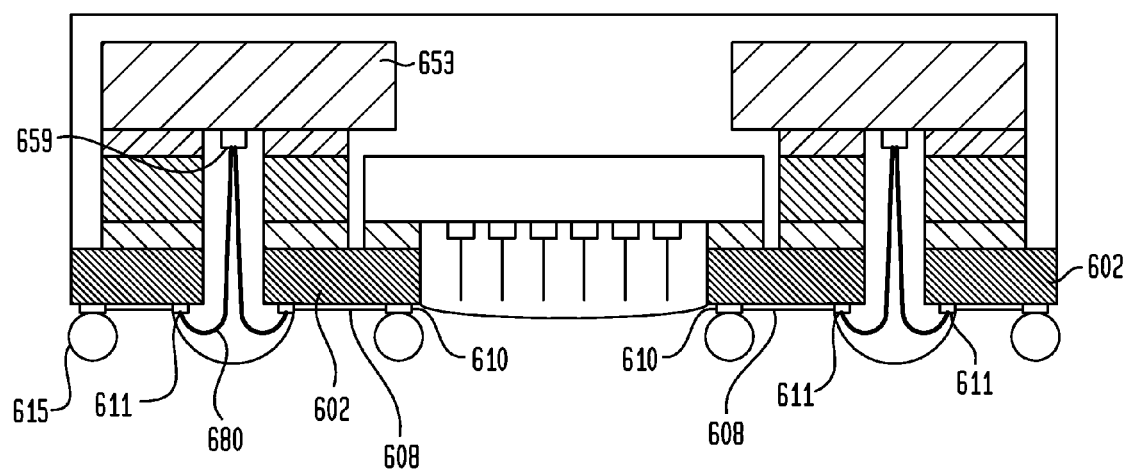
FIG. 15 is cross-sectional view of FIG. 14 taken along line 15-15.

As shown in FIG. 14, as in the previous embodiments, the second microelectronic element may include three regions, a first outer region 966, a second outer region 968, and a central region 970 positioned between the first outer region 966 and the second outer region 968. Bond pads 659 (FIG. 15) on the second microelectronic element 653 are positioned on the first outer region 966 of the front surface 657 of the second microelectronic element 653. To accommodate the location of the bond pads 659 on the first outer region 966 of the second microelectronic element 653, the second opening 626 of the substrate 602 is also positioned in the first outer region 966, directly adjacent the edge 612 (FIG. 14) of the substrate 602. Referring to FIG. 15, conductive connections are then capable of extending from the bond pads 659 on the second microelectronic element 653 to a second set of contacts 611 on the second surface 606 of the substrate 602. Traces 608 electrically connect the second set of contacts 611 to terminal contacts 610, which support solder balls 615.

It is to be appreciated that although in the previously disclosed embodiments, bond wires extending through an opening in the substrate were used to establish an electrical connection between the microelectronic element and contacts on the second surface of the substrate, any known structures or methods for establishing such a connection may be used. For example, in one embodiment, referring to FIGS. 16-17B, first and second microelectronic elements 736,753 are stacked in a manner similar to the embodiment shown in FIGS. 1-3. In this alternative embodiment, two additional types of bonding are illustrated. Such bonding techniques are disclosed, for example, in U.S. Pat. No. 5,861,666, the disclosure of which is incorporated herein by reference.

Figure 17A:
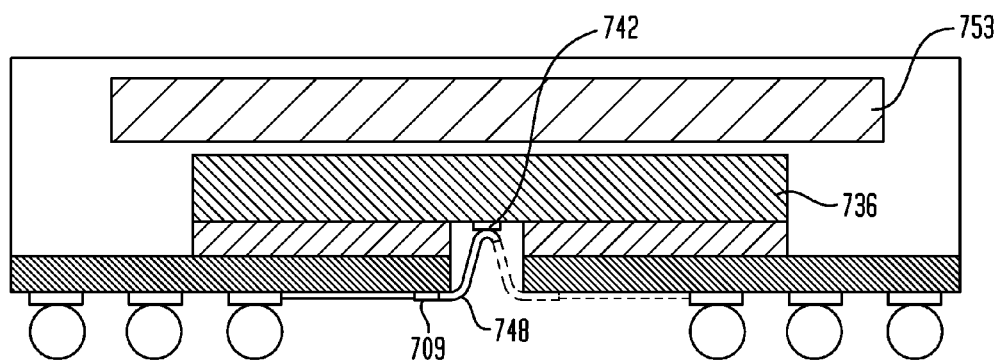
FIG. 17A is cross-sectional view of FIG. 16 taken along line 17A-17A.
Figure 17B:
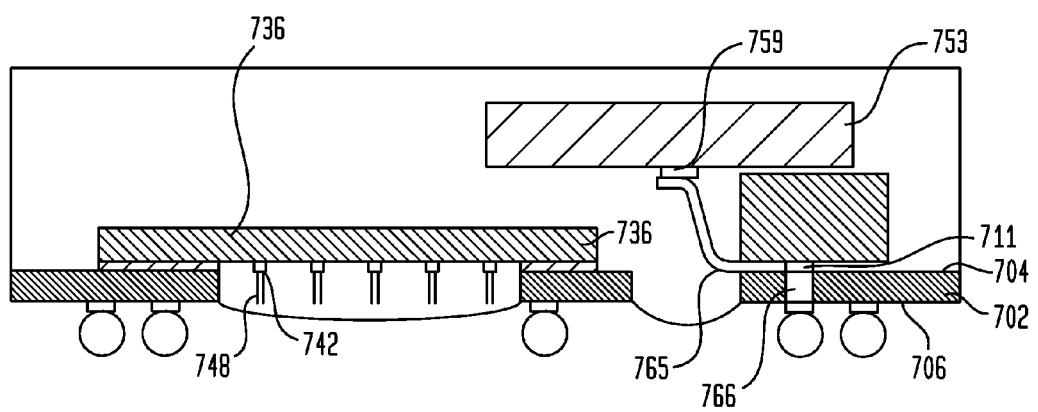
FIG. 17B is cross-sectional view of FIG. 16 taken along line 17B-17B.

Referring first to FIG. 17A, a lead bond 748 is shown extending from the bond pad 742 on the first microelectronic element 736 to the first set of contacts 709 on the second surface 706 of the substrate 702. The lead bond 748 is substantially more rigid than the bond wires disclosed in the previous embodiments. Turning now to FIG. 17B, a similar lead bond 765 may extend from the bond pad on the second microelectronic element 753 to the second set of contacts 711 on the first surface 704 of the substrate 702, as opposed to the second surface 706 of the substrate 702. A via 766 may extend between the first surface 704 and second surface 706 of the substrate 702. The via 766 may be filled with conductive material to conductively connect the contact on the first surface of the substrate with the terminal contact 710 on the second surface 706 of the substrate 702.

Figure 18:
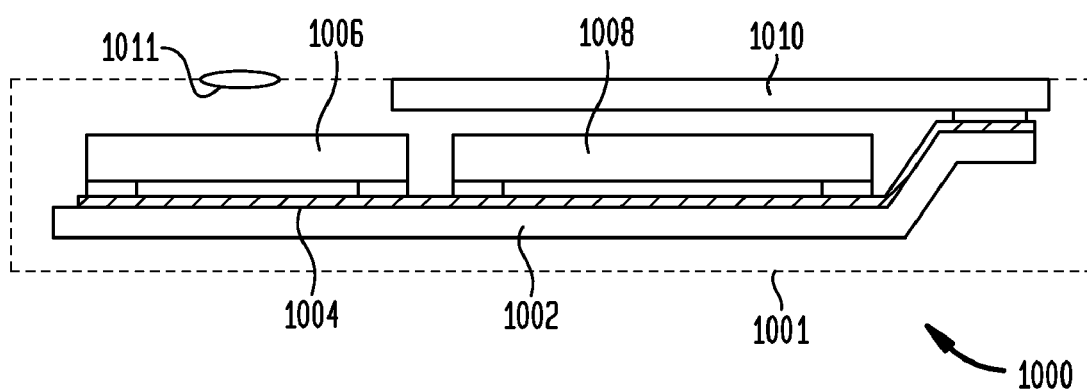
FIG. 18 is a schematic depiction of a system according to one embodiment of the invention.

The various microelectronic assemblies discussed above can be utilized in construction of diverse electronic systems. For example, referring to FIG. 18, a system 1000 in accordance with a further embodiment of the invention includes a structure 1006 as described in the prior embodiments of microelectronic assemblies above in conjunction with other electronic components 1008 and 1010. In the example depicted, component 1008 is a semiconductor chip whereas component 1010 is a display screen, but any other components can be used. Of course, although only two additional components are depicted in FIG. 18 for clarity of illustration, the system may include any number of such components. The structure 1006 as described above may be, for example, a composite chip or a structure incorporating plural chips. In a further variant, both may be provided, and any number of such structures may be used. Structure 1006 and components 1008 and 1010 are mounted in a common housing 1001, schematically depicted in broken lines, and are electrically interconnected with one another as necessary to form the desired circuit. In the exemplary system shown, the system includes a circuit panel 1002 such as a flexible printed circuit board, and the circuit panel includes numerous conductors 1004, of which only one is depicted in FIG. 18, interconnecting the components with one another. However, this is merely exemplary; any suitable structure for making electrical connections can be used. The housing 1001 is depicted as a portable housing of the type usable, for example, in a cellular telephone or personal digital assistant, and screen 1010 is exposed at the surface of the housing. Where structure 1006 includes a light-sensitive element such as an imaging chip, a lens 1011 or other optical device also may be provided for routing light to the structure. Again, the simplified system shown in FIG. 18 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments in various combinations.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
a substrate having first and second opposed surfaces, each extending in a first direction and a second direction transverse to the first direction, the substrate having first and second openings extending between the first and second surfaces, the first opening elongated in the first direction and the second opening elongated in the second direction;
a first microelectronic element having a front surface facing the first surface, and bond pads exposed at the front surface and aligned with the first opening, the first microelectronic element having a rear surface opposite the front surface and an edge extending between the front and rear surfaces and extending in the second direction; and
a second microelectronic element having a front surface facing the rear surface of the first microelectronic element and projecting in the first direction beyond the edge of the first microelectronic element, the front surface of the second microelectronic element having first and second opposed edges extending between the front and rear surface of the second microelectronic element and extending in the second direction, and having a first outer region adjacent the first edge, a second outer region adjacent the second edge, and a central region disposed between the first and second outer regions, each of the first and second outer regions and the central region having equal width such that the central region extends a middle third of a distance between the first and second edges,
the second microelectronic further having bond pads disposed in the central region aligned with the second opening,
wherein the bond pads of the first and second microelectronic elements are electrically connected to conductive elements of the substrate.

2. The microelectronic assembly of claim 1, wherein the bond pads of the first microelectronic element are electrically connected to the conductive elements by first leads having portions aligned with the first opening, and the bond pads of the second microelectronic element are electrically connected to the conductive elements by second leads having portions aligned with the second opening.

3. The microelectronic assembly of claim 1, wherein the bond pads of the first microelectronic element are electrically connected to the conductive elements by first wire bonds extending through the first opening and the bond pads of the second microelectronic element are electrically connected to the conductive elements by second wire bonds extending through the second opening.

4. The microelectronic assembly of claim 2, wherein at least one of: the first leads do not extend through the first opening, or the second leads do not extend through the second opening in the substrate.

5. The microelectronic assembly of claim 1, further comprising a heat spreader in thermal communication with at least a portion of at least one of the first and second microelectronic elements.

6. The microelectronic assembly of claim 1, wherein the first microelectronic element has first and second opposed edges extending in the first direction, the front surface of the first microelectronic element and the edge and the first and second opposed edges of the first microelectronic element being such that:
the edge extends between the first and second opposed edges, the front surface has a first outer region adjacent the first edge of the first microelectronic element, a second outer region adjacent the second edge of the first microelectronic element, and a central region disposed between the first and second outer regions of the front surface of the first microelectronic element, each of the first and second outer regions and the central region having equal width such that the central region of the first microelectronic element extends a middle third of a distance between the first and second edges, wherein the bond pads of the first microelectronic element are disposed in such central region and are aligned with the first opening.

7. The microelectronic assembly of claim 1, further comprising:
a third microelectronic element,
wherein the substrate further includes a third opening extending between the first and second surfaces and elongated in the second direction,
wherein the edge of the first microelectronic element is a first edge thereof, the third microelectronic element has a front surface facing the rear surface of the first microelectronic element and projecting beyond a second edge of the first microelectronic element opposite from the first edge thereof,
wherein the third microelectronic element has bond pads exposed at the front surface thereof aligned with the third opening and electrically connected to the conductive elements.

8. The microelectronic assembly of claim 7, wherein the third microelectronic element has first and second opposed edges, the front surface of the third microelectronic element has a first outer region adjacent the first edge of the third microelectronic element, a second outer region adjacent the second edge of the third microelectronic element, and a central region disposed between the first and second outer regions of the front surface of the third microelectronic element, each of the first and second outer regions and the central region having equal width such that the central region of the third microelectronic element extends a middle third of a distance between the first and second edges, wherein the bond pads of the third microelectronic element are disposed in such central region and are aligned with the third opening.

9. The microelectronic assembly of claim 8, further comprising third leads, wherein the bond pads of the third microelectronic element are electrically connected with at least some of the conductive elements of the substrate by the third leads.

10. The microelectronic assembly of claim 7, wherein at least one row of five or more of the bond pads of the third microelectronic element is disposed adjacent a peripheral edge of the third microelectronic element.

11. The microelectronic assembly of claim 8, wherein the front surfaces of the second and third microelectronic elements are positioned in a single plane.

12. The microelectronic assembly of claim 7, wherein the third microelectronic element overlies at least a portion of the second microelectronic element.

13. A system comprising a microelectronic assembly according to claim 1 and one or more other electronic components electrically connected to the microelectronic assembly.

14. The system as recited in claim 13, further comprising a housing, the microelectronic assembly and the other electronic components being mounted to the housing.

15. A microelectronic assembly, comprising:
a substrate having opposed first and second surfaces each extending in a first direction and in a second direction transverse to the first direction, at least one first opening extending between the first and second surfaces, and at least one second opening extending between the first and second surfaces;
a first microelectronic element having a front surface facing the first surface of the substrate, the first microelectronic element having a rear surface opposite the front surface and an edge extending between the front and rear surfaces and extending in the second direction, and the first microelectronic element having at least one row of five or more bond pads extending in the first direction along the front surface of the first microelectronic element aligned with the at least one first opening; and a second microelectronic element having a front surface facing the rear surface of the first microelectronic element, the front surface of the second microelectronic element having first and second opposed edges, the front surface of the second microelectronic element projecting in the first direction beyond the edge of the first microelectronic element, and having a first outer region adjacent the first edge, a second outer region adjacent the second edge, and a central region disposed between the first and second outer regions, each of the first and second outer regions and the central region having equal width such that the central region extends a middle third of a distance between the first and second edges, the second microelectronic element further having at least one row of five or more bond pads extending in the second direction along the front surface of the second microelectronic element and disposed in the central region and aligned with the at least one second opening, wherein the bond pads of the first and second microelectronic elements are electrically connected to conductive elements of the substrate.

16. The microelectronic assembly of claim 15, wherein the first microelectronic element has first and second opposed edges extending in the first direction, the front surface of the first microelectronic element and the edge and the first and second opposed edges of the first microelectronic element being such that:

the edge extends between the first and second opposed edges, the front surface has a first outer region adjacent the first edge of the first microelectronic element, a second outer region adjacent the second edge of the first microelectronic element, and a central region disposed between the first and second outer regions of the front surface of the first microelectronic element, each of the first and second outer regions and the central region having equal width such that the central region of the first microelectronic element extends a middle third of a distance between the first and second edges, wherein the bond pads of the first microelectronic element are disposed in such central region and are aligned with the at least one first opening.

17. The microelectronic assembly of claim 15, wherein the edge of the first microelectronic element is a first edge thereof, the microelectronic assembly further comprising:

a third microelectronic element having a front surface facing the rear surface of the first microelectronic element and projecting beyond a second edge of the first microelectronic element opposite from the first edge thereof, wherein the third microelectronic element has at least one row of bond pads extending in the second direction along the front surface thereof which are aligned with a third opening extending through the substrate and electrically connected to the conductive elements.

18. The microelectronic assembly of claim 17, wherein the third microelectronic element has first and second opposed edges, the front surface of the third microelectronic element has a first outer region adjacent the first edge of the third microelectronic element, a second outer region adjacent the second edge of the third microelectronic element, and a central region disposed between the first and second outer regions of the front surface of the third microelectronic element, each of the first and second outer regions and the central region having equal width such that the central region of the third microelectronic element extends a middle third of a distance between the first and second edges, wherein the bond pads of the third microelectronic element are disposed in such central region and are aligned with the third opening.

19. The microelectronic assembly of claim 18, wherein the front surfaces of the second and third microelectronic elements are positioned in a single plane.

20. The microelectronic assembly of claim 17, further comprising a buffer element electrically connected with at least some terminals exposed at the second surface of the substrate and with one or more of the microelectronic elements through the conductive elements of the substrate, the buffer element being configured to regenerate at least one signal received at least one of the terminals and to transfer the regenerated at least one signal through at least one of the conductive elements to the one or more microelectronic elements.

21. The microelectronic assembly of claim 17, wherein the third microelectronic element overlies at least a portion of the second microelectronic element.

22. The microelectronic assembly of claim 1, further comprising first leads extending through the first opening and second leads, wherein the first leads electrically connect at least some of the bond pads of the first microelectronic element with the conductive elements of the substrate, and wherein the second leads have portions aligned with the second opening and the second leads do not extend through the second opening, the second leads electrically connecting at least some of the bond pads of the second microelectronic element with the conductive elements of the substrate.

23. The microelectronic assembly of claim 8, further comprising a first spacer disposed between the front surface of the second microelectronic element and the first surface of the substrate and a second spacer disposed between the front surface of the third microelectronic element and the first surface of the substrate.

24. The microelectronic assembly of claim 7, further comprising an additional microelectronic element having a front surface facing the first surface of the substrate and a rear surface opposite the front surface, wherein portions of the front surfaces of the second and third microelectronic elements face the rear surface of the additional microelectronic element and the additional microelectronic element has bond pads at the front surface thereof aligned with an additional opening of the substrate and electrically connected to the conductive elements.

25. The microelectronic assembly of claim 24, wherein the additional microelectronic element has first and second opposed edges extending in the first direction, the front surface of the additional microelectronic element has a first outer region adjacent the first edge of the additional microelectronic element, a second outer region adjacent the second edge of the additional microelectronic element, and a central region disposed between the first and second outer regions of the front surface of the additional microelectronic element, each of the first and second outer regions and the central region thereof having equal width such that the central region of the additional microelectronic element extends a middle third of a distance between the first and second edges, wherein the bond pads of the additional microelectronic element are disposed in such central region and are aligned with the additional opening.

26. The microelectronic assembly of claim 24, further comprising additional leads, wherein the bond pads of the additional microelectronic element are electrically connected with at least some of the conductive elements of the substrate by the additional leads.

27. The microelectronic assembly of claim 15, wherein the at least one first opening includes a plurality of first openings extending in the first direction of the substrate.

28. The microelectronic assembly of claim 15, wherein the at least one second opening includes a plurality of second openings extending in the second direction of the substrate.

29. The microelectronic assembly of claim 18, wherein the conductive elements are electrically connected with the bond pads of the first, second and third microelectronic elements by first leads having at least portions aligned with the first opening, second leads having at least portions aligned with the second opening, and third leads having at least portions aligned with the third opening, respectively.

30. The microelectronic assembly of claim 18, wherein the first, second and third leads are first wire bonds, second wire bonds and third wire bonds extending through the first, second and third openings, respectively.

* * * * *